(12) United States Patent
Webb et al.

(10) Patent No.: US 6,294,060 B1
(45) Date of Patent: Sep. 25, 2001

(54) CONVEYORIZED ELECTROPLATING DEVICE

(75) Inventors: Joseph M. Webb, Derry; Jerome R. Faucher, Nashua, both of NH (US)

(73) Assignee: ATI Properties, Inc., Los Angeles, CA (US)

( * ) Notice: Subject to any disclaimer, the term of this patent is extended or adjusted under 35 U.S.C. 154(b) by 0 days.

(21) Appl. No.: 09/422,612

(22) Filed: Oct. 21, 1999

(51) Int. Cl.[7] ............................. B65G 49/00; C25D 17/00
(52) U.S. Cl. .................... 204/198; 204/202; 204/224 R; 205/125; 205/137
(58) Field of Search ............................... 204/198, 224 R, 204/202, 203, 204, 205

(56) References Cited

U.S. PATENT DOCUMENTS

| | | |
|---|---|---|
| 4,402,800 * | 9/1983 | Ash et al. ........................ 204/15 |
| 4,405,431 | 9/1983 | Pfeifer et al. . |
| 4,610,772 * | 9/1986 | Palnik ............................. 204/206 |
| 4,668,358 | 5/1987 | Ball . |
| 4,776,939 | 10/1988 | Blasing et al. . |
| 5,292,424 | 3/1994 | Blasing et al. . |
| 5,324,406 | 6/1994 | Anderson et al. . |
| 5,401,370 | 3/1995 | Kauper et al. . |
| 5,441,619 * | 8/1995 | Kawachi et al. ................. 204/206 |
| 5,494,529 | 2/1996 | Ciccarelli et al. . |
| 5,553,633 | 9/1996 | Ciccarelli, Jr. et al. . |
| 5,553,700 | 9/1996 | Smith et al. . |
| 5,658,441 * | 8/1997 | Spain et al. ..................... 204/203 |
| 5,766,685 | 6/1998 | Smith et al. . |
| 5,932,081 | 8/1999 | Kopp et al. . |
| 6,099,711 | 8/2000 | Dahms et al. . |
| 6,168,691 | 1/2001 | Kauper et al. . |
| 6,179,844 | 1/2001 | Maurer . |
| 6,186,316 | 2/2001 | Denis . |

FOREIGN PATENT DOCUMENTS 0 517 349 B1   6/1992   (EP) .

* cited by examiner

Primary Examiner—Robert Dawson
Assistant Examiner—Michael J Feely
(74) Attorney, Agent, or Firm—Kirkpatrick & Lockhart LLP

(57) ABSTRACT

A conveyorized electroplating device having an anode positioned proximate to a plurality of absorptive applicator assemblies that apply a plating solution to a substrate and a conveyor device that grips the substrate thereby isolating the electrical contact from the plating solution. The conveyorized electroplating device has a fluid bed assembly with a manifold and an anode, a conveyor device adjacent to the fluid bed assembly, and a plurality of absorptive applicator assemblies, wherein the plurality of absorptive applicator assemblies are adjacent and in close proximity to the anode and in fluid communication with the fluid bed assembly. The conveyor device isolates the electrical contacts from the plating solution and is able to handle various sizes and thicknesses of substrates. The conveyor device of the present invention comprises a drive assembly and a gripper assembly connected thereto, wherein the gripper assembly has a non-metallic housing, a metallic member slideably mounted within a cavity defined by the non-metallic housing, an arm pivotably mounted to the housing and forming a passageway, and a seal mounted adjacent to the arm.

21 Claims, 37 Drawing Sheets

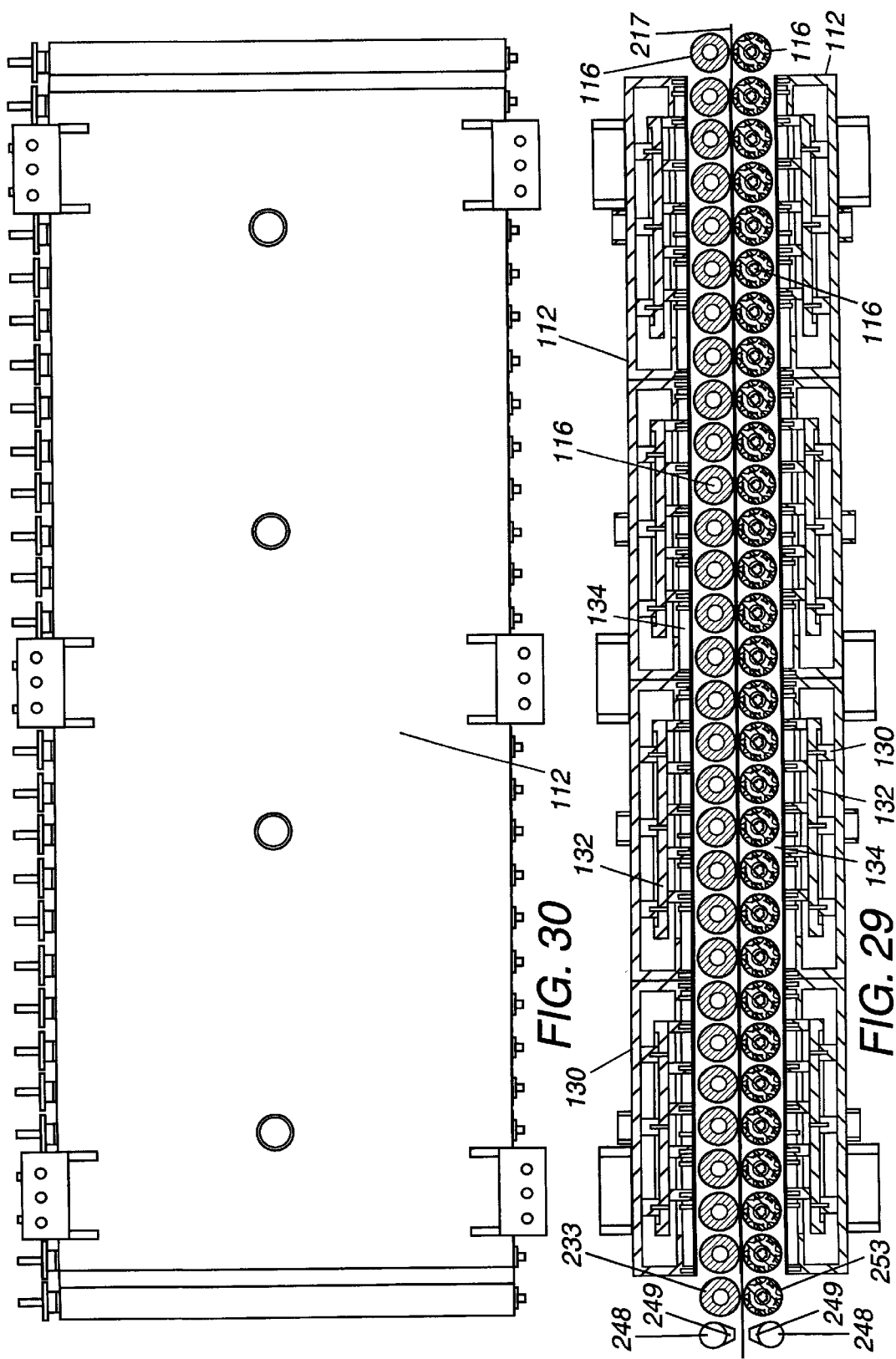

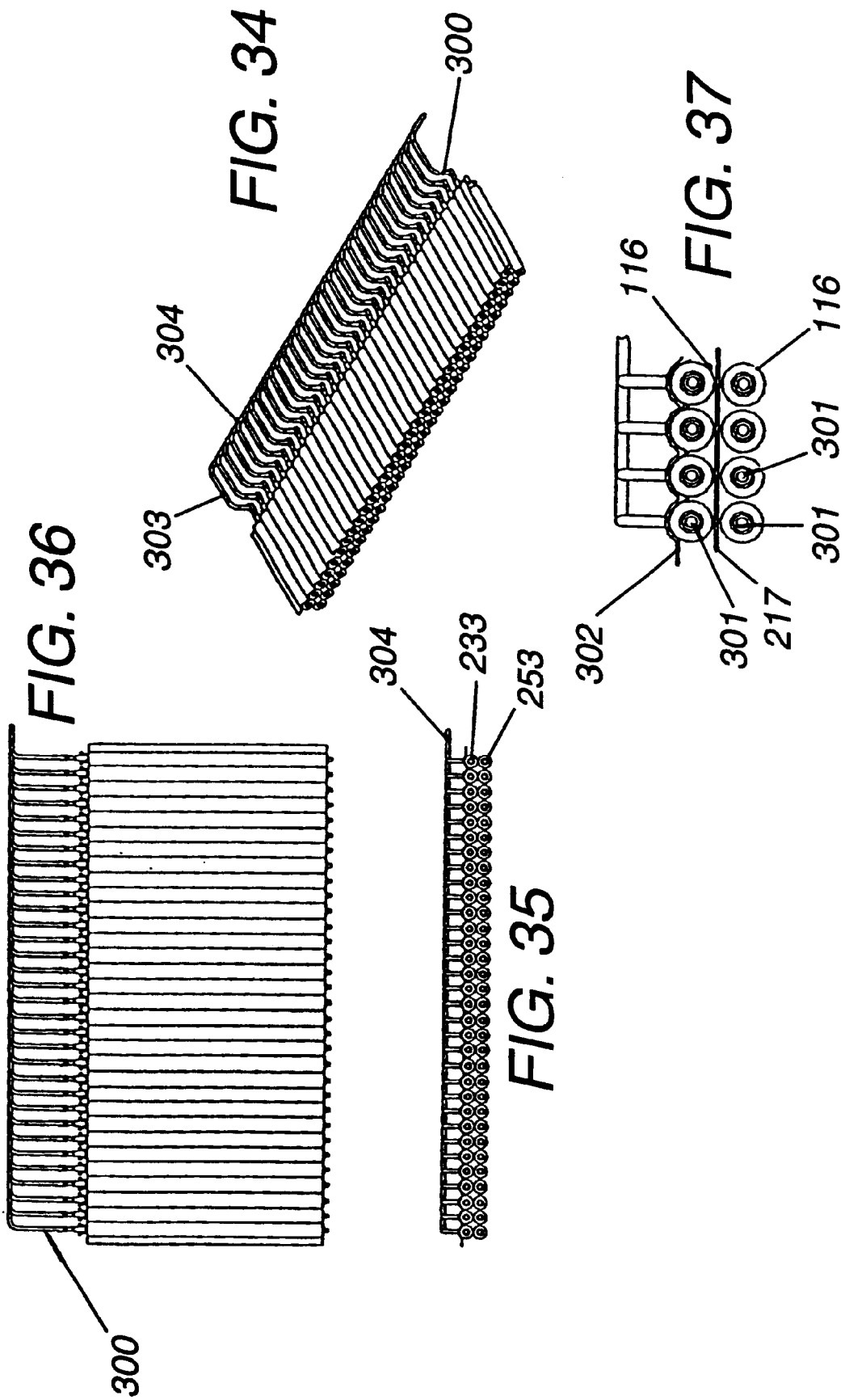

CONVEYORIZED ELECTROPLATING DEVICE

CROSS REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

1. Field of the Invention

The present invention generally relates to apparatus and methods for conveying and electroplating a substrate. More particularly, the present invention is generally directed to a conveyorized electroplating device having an anode positioned proximate to a plurality of absorptive applicator assemblies that apply a plating solution to the substrate and a conveyor device that grips the substrate thereby isolating the electrical contact from the plating solution.

2. Description of the Invention Background

Many conventional electroplating devices typically employ mechanisms for moving substrates through a series of large baths or large tanks containing a plating solution. One of the disadvantages of this type of electroplating device is the lengthy amount of time to complete the electroplating process. For example, electroplating one (1) mil of copper in holes contained within a substrate may take in excess of one (1) hour. Another disadvantage of this type of conventional electroplating device is the relatively low exchange of metallic ions at the substrate surface due to the limitations of the bath circulation and the off contact nature of the anode/cathode positions.

Some conventional horizontal electroplating conveyor systems that deliver electrical power to the substrate include a driven roller type conveyor system and a non-driven roller type conveyer system. The driven roller type conveyor system includes solid or disk type rollers to convey the substrate through the plating area. The non-driven roller system grips the substrate at its edges by spring loaded contacts and pulls the substrate through the plating area. Both of these systems suffer from the problem of exposing electrified metallic surfaces to plating solution which necessitates the removal of the resulting undesired plating from the roller assemblies thus, preventing them from acting as reliable and dimensionally stable electrical contacts so that current can be delivered to the substrate.

Thus, the need exists for a conveyorized electroplating device that can electroplate a substrate in a relatively short time while providing a high exchange of metallic ions at the substrate surface resulting in a substrate that has a uniform electroplated surface.

The need also exists for a conveyorized electroplating device that minimizes the need to recondition the electrical contacts that are exposed to plating solution thus, assuring a more reliable and repeatable contact point and a more stable process.

Yet another need exists for a conveyorized electroplating device that has the ability to handle substrates of various sizes and thickness without the need for mechanical adjustment.

SUMMARY OF THE PRESENT INVENTION

One form of the present invention provides a conveyorized electroplating device that electroplates a substrate in a relatively short time and exhibits a relatively high exchange of metallic ions at the substrate resulting in a uniform electroplated surface.

The present invention may also include a conveyorized electroplating device comprising a fluid bed assembly having a manifold and an anode, a conveyor device adjacent to the fluid bed assembly, and a plurality of absorptive applicator assemblies wherein the plurality of absorptive applicator assemblies are adjacent and in close proximity to the anode and in fluid communication with the fluid bed assembly.

The present invention may also include a fluid bed assembly having a plurality of baffles received within the manifold such that the plating solution will flow uniformly from the fluid bed assembly.

The present invention may comprise a conveyorized electroplating device that includes a plurality of absorptive applicator assemblies, a conveyor device and an anode, wherein each of the plurality of absorptive applicator assemblies has a profile and defines a fluid passageway that delivers plating solution thereto, and wherein the anode has a profile that corresponds to the profiles of the absorptive applicator assemblies.

Another embodiment of the present invention provides for a conveyor device that isolates the electrical contacts from the plating solution and that is able to handle various sizes and thicknesses of substrates. The conveyor device of the present invention may include a drive assembly and a gripper assembly connected thereto, wherein the gripper assembly has a non-metallic housing, a metallic member slideably mounted within a cavity defined by the non-metallic housing, an arm pivotably mounted to the housing and forming a passageway, and a seal mounted adjacent to the arm.

The present invention further provides for a modular conveyorized electroplating device, wherein multiple modular conveyorized electroplating devices are used together depending on the specific needs of the application. Furthermore, the modular conveyorized electroplating device makes it easy for the user to maintain and replace one or more of the modular conveyorized electroplating devices.

The present invention may also comprise a method of conveying and electroplating a substrate, comprising gripping the substrate at the edges thereof, electrifying the substrate, moving the substrate on or between a plurality of absorptive applicator assemblies, pumping a plating solution in contact with the absorptive applicator assemblies and onto the substrate, and isolating the electrical contact at the substrate from the plating solution.

Other details, objects and advantages of the present invention will become more apparent with the following description of the present invention.

BRIEF DESCRIPTION OF THE DRAWINGS

For the present invention to be readily understood and practiced, various embodiments will be described in conjunction with the following figures wherein:

FIG. 29 is a sectional view of the conveyorized electroplating device of the present invention shown in FIG. 28;

FIG. 30 is a top view of the conveyorized electroplating device of the present invention shown in FIG. 28;

FIG. 34 is a perspective view of yet another embodiment of the conveyorized electroplating device of the present invention;

FIG. 35 is a sectional view of the conveyorized electroplating device of the present invention shown in FIG. 34;

FIG. 36 is a top view of the conveyorized electroplating device of the present invention shown in FIG. 34;

FIG. 37 is an enlarged view of the conveyorized electroplating device of the present invention shown in FIG. 34 illustrating the anode and the absorptive applicator assemblies;

DETAILED DESCRIPTION OF THE INVENTION

The present invention will be described below in terms of apparatuses and methods for electroplating and conveying a circuit board. It should be noted that describing the present invention in terms of electroplating and conveying a circuit board is for illustrative purposes and the advantages of the present invention may be realized using other structures and technologies that have a need for an apparatus and a method for electroplating and/or conveying a substrate.

It is to be further understood that the Figures and descriptions of the present invention have been simplified to illustrate elements that are relevant for a clear understanding of the present invention, while eliminating, for purposes of clarity, other elements and/or descriptions thereof found in a typical conveyorized electroplating device. Those of ordinary skill in the art will recognize that other elements may be desirable in order to implement the present invention. However, because such elements are well known in the art, and because they do not facilitate a better understanding of the present invention, a discussion of such elements is not provided herein.

Figure 1:
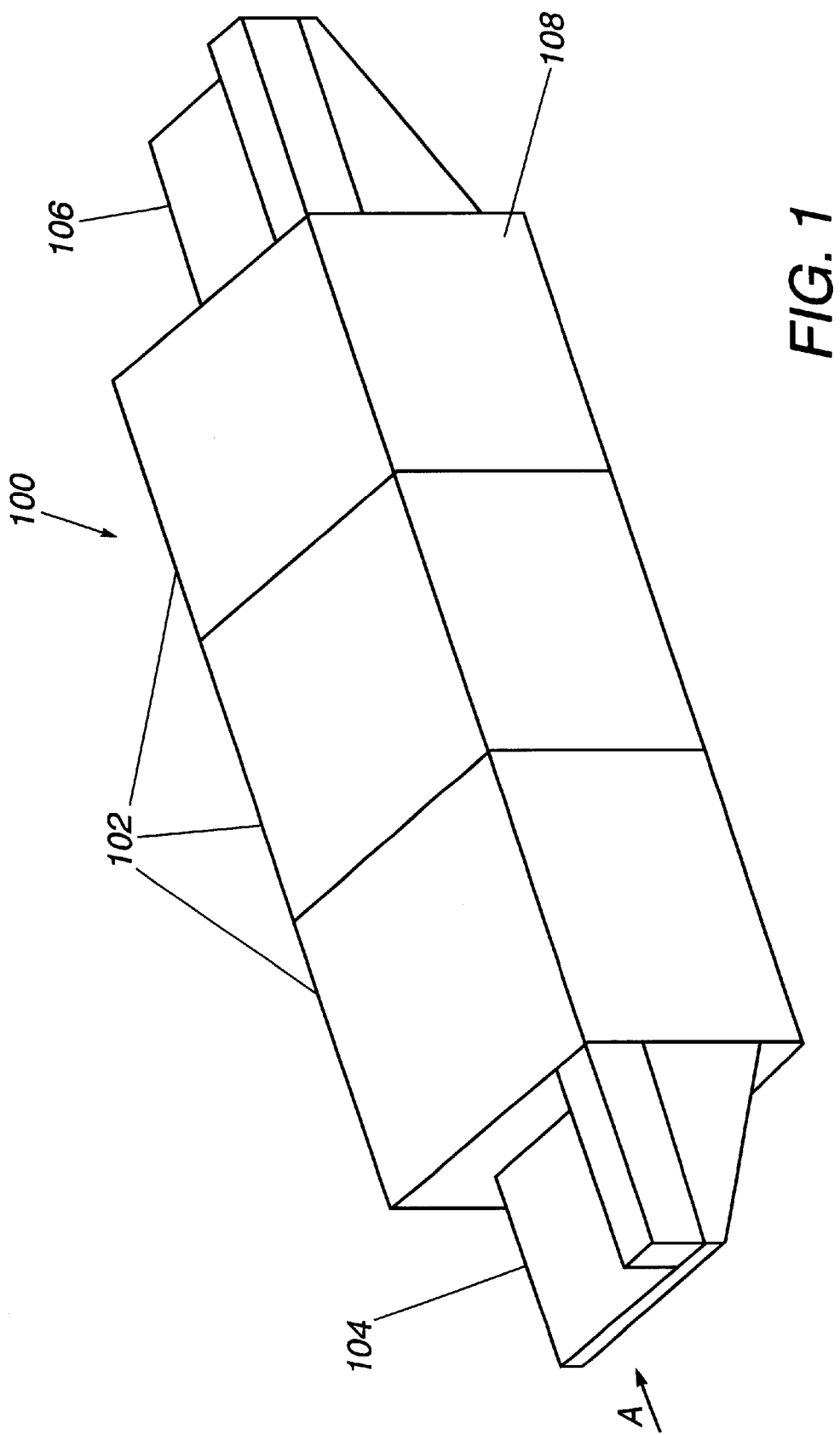
FIG. 1 is a perspective view of the conveyorized electroplating device of the present invention wherein several modules are placed end to end to create the desire length of the electroplating process.

FIG. 1 is a perspective view of the modular conveyorized electroplating device 100 of the present invention, wherein several modules 102 can be placed end to end to create the desire length of the electroplating process. Although the illustrated modular conveyorized electroplating device system 100 of FIG. 1 comprises three modules, any number of modules 102 can be placed end to end. The modular conveyorized electroplating device system 100 has an input station 104 and an output station 106 such that a circuit board substrate (not shown) is loaded into the modular conveyorized electroplating device system 100 at the input station 104 and exits at the output station 106 after being electroplated. The housing 108 of the modular conveyorized electroplating device system 100 may have several removable panels such that the internal mechanisms of the modular conveyorized electroplating device 110 can be easily accessed for maintenance.

Figure 2:
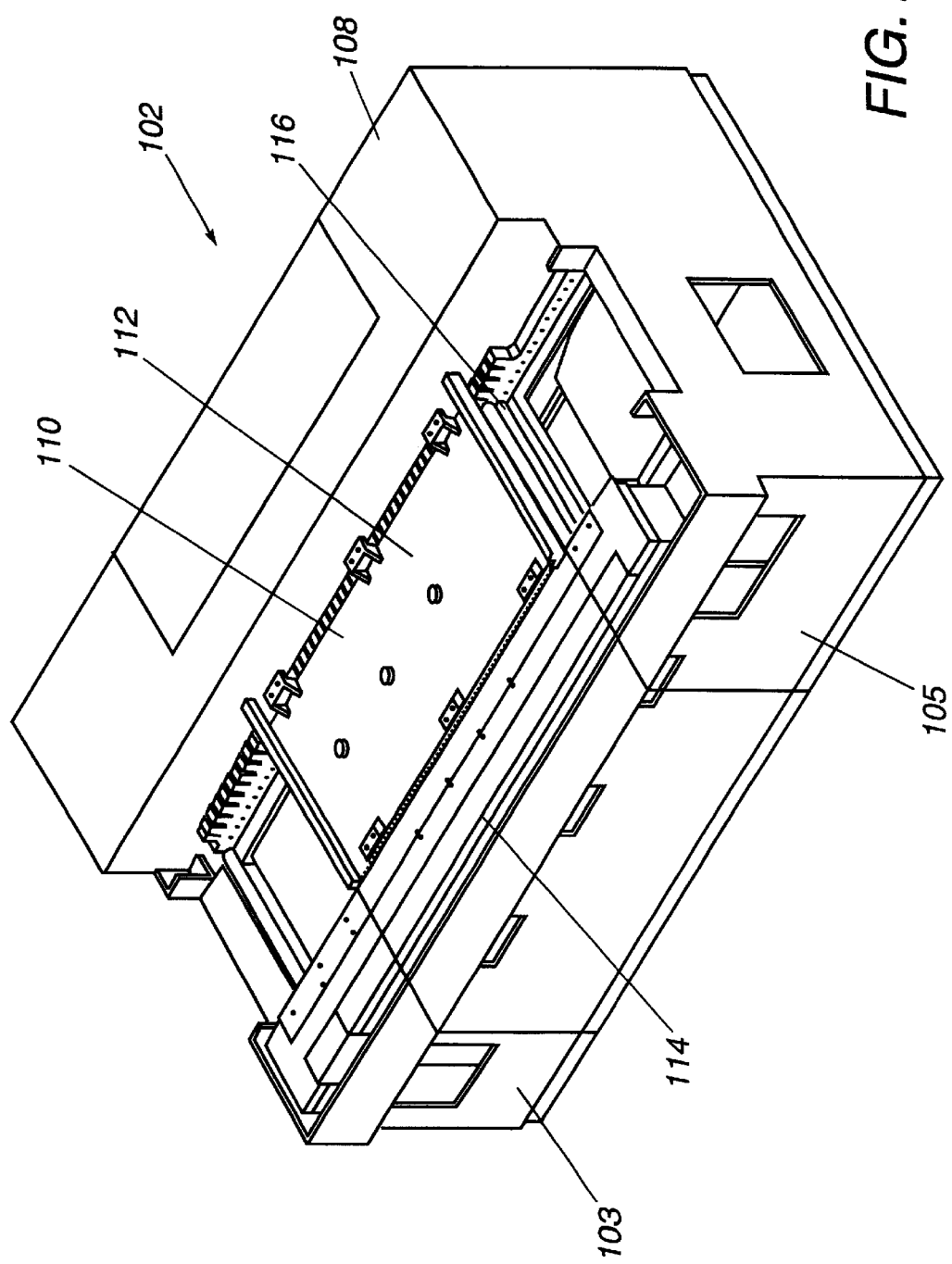
FIG. 2 is a perspective view of one of the modules of the conveyorized electroplating device of the present invention, wherein a portion of the housing has been removed.

FIG. 2 is a perspective view of one of the modules 102 of the modular conveyorized electroplating device system 100 of the present invention, wherein part of the housing 108 has been removed for clarity. The module may include an input section 103 and an output section 105 if used alone. The modular configuration of the conveyorized electroplating device system 100 allows for the fluid bed assembly 112, the conveyor device 114 and the absorptive applicator assemblies 116 to be easily removed from the module 102 for maintenance and replacement thereof Each of the modules 102 of the conveyorized electroplating device system 100 comprises one or more fluid bed assemblies 112, a conveyor device 114 and absorptive applicator assemblies 116, each of which are discussed in greater detail below.

Figure 3:
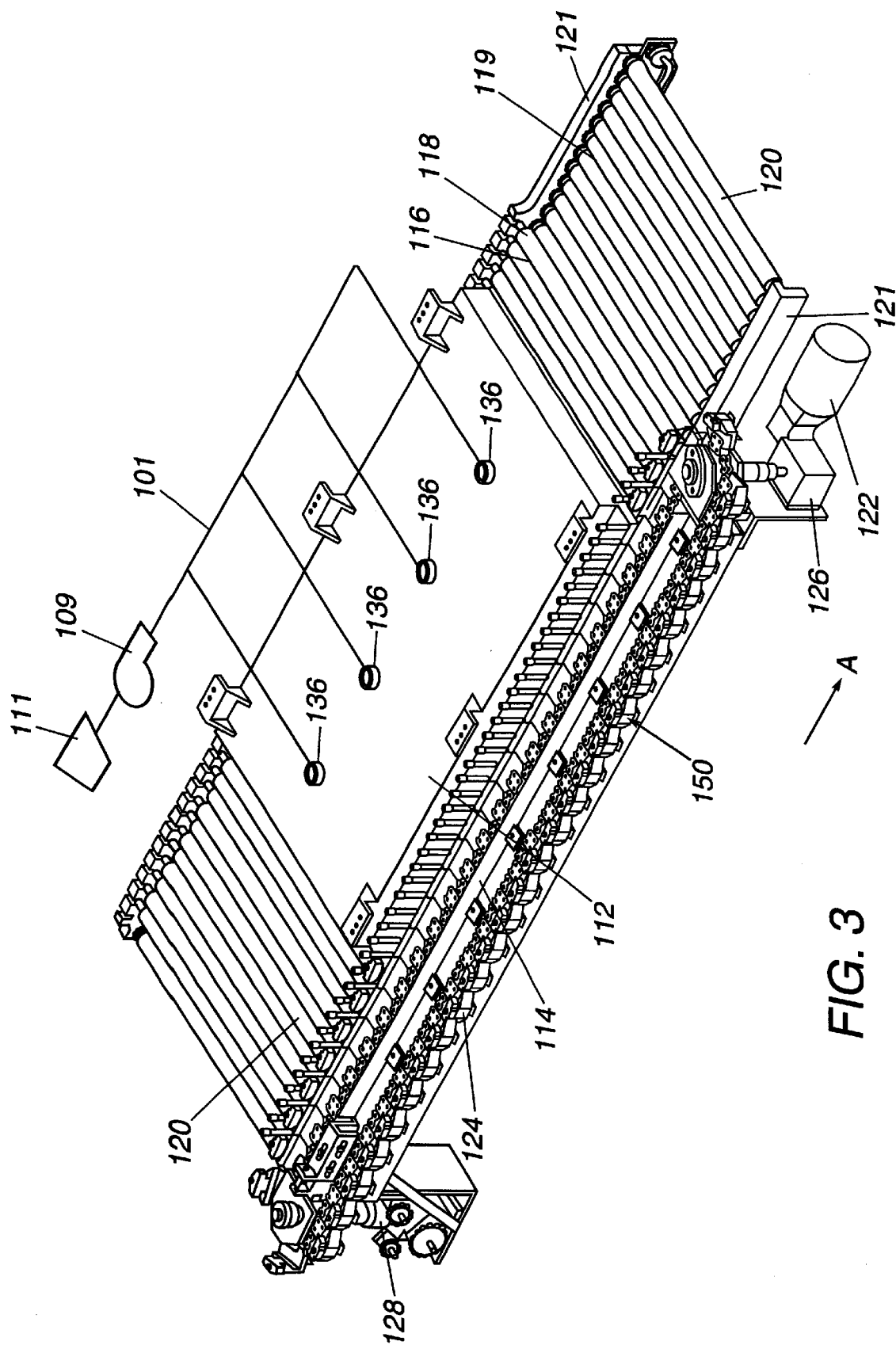
FIG. 3 is a perspective view of one of the modules of the conveyorized electroplating device of the present invention, wherein the entire housing has been removed.

FIG. 3 is a perspective view of a single conveyorized electroplating device 110 of the present invention, wherein the housing 108 has been completely removed for clarity. The fluid bed assembly 112 extends across and above some of the absorptive applicator assemblies 116. One of the longitudinal edges of the fluid bed assembly 112 is parallel and adjacent to the longitudinal axis of the conveyor device 114. The absorptive applicator assemblies 116 comprise upper roller assemblies 118 and corresponding lower roller assemblies 120. The lower roller assemblies 120 define a track 119 for the circuit board substrate to travel thereon. The upper and lower roller assemblies 118 and 120 are rotatably supported at their ends by bearing blocks 121. The longitudinal edge of the conveyor device 114 is adjacent and parallel to the longitudinal edge of the absorptive applicators assemblies 116. The conveyor device 114 also includes a drive assembly 150 and a gripper assembly 124.

Figure 4:
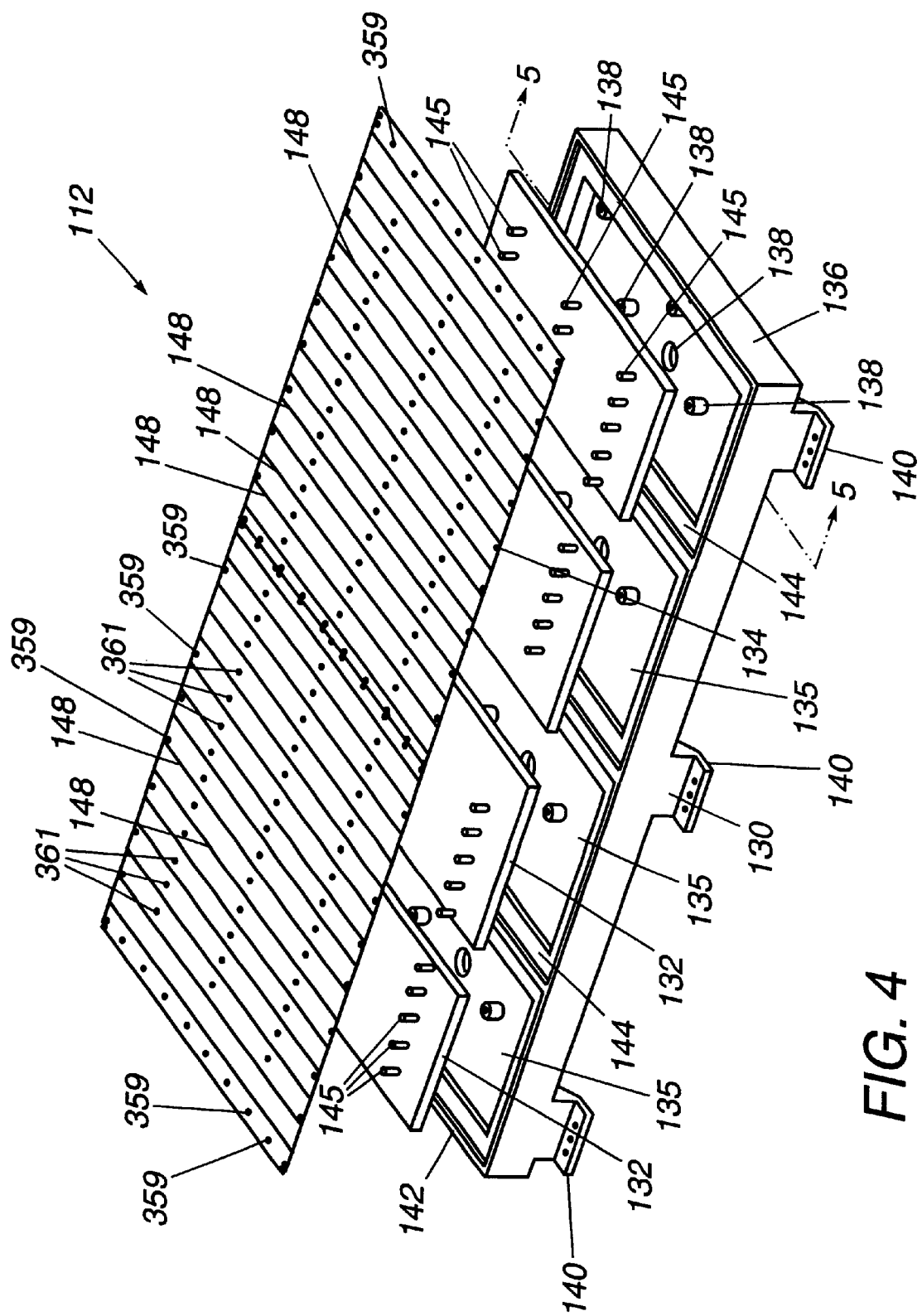
FIG. 4 is an exploded view of a fluid bed assembly of the conveyorized electroplating device of the present invention shown in FIG. 3.
Figure 5:
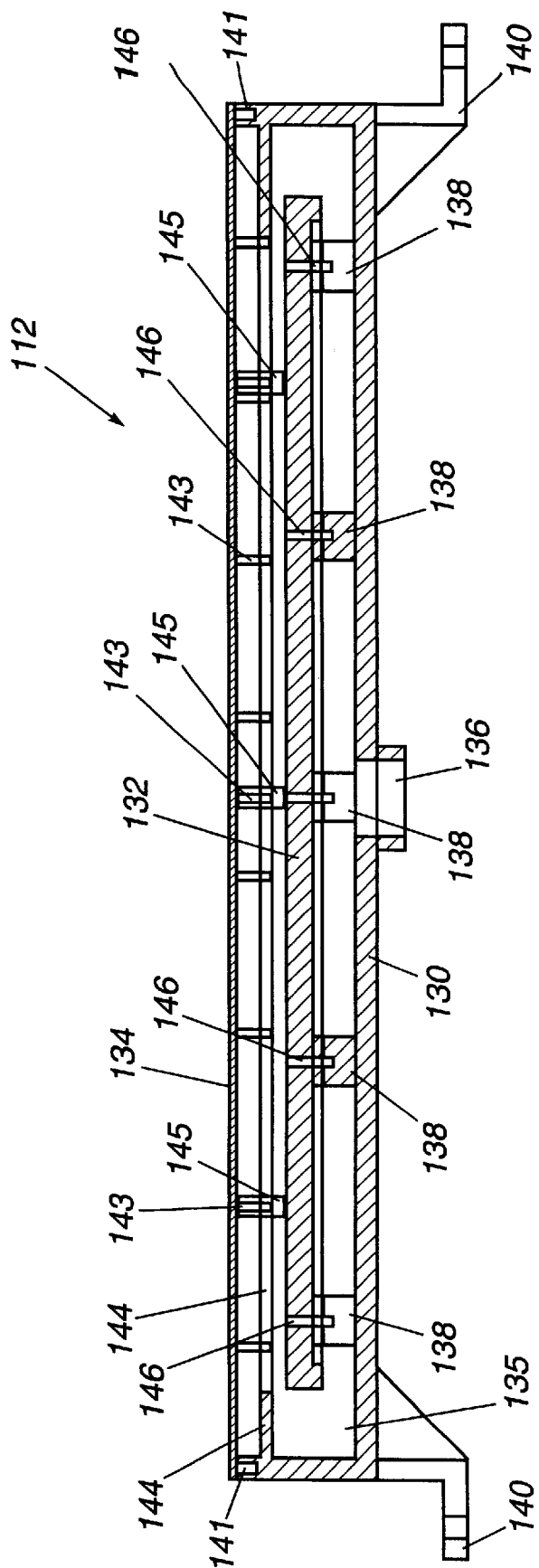
FIG. 5 is a cross-sectional view of a fluid bed assembly of the present invention shown in FIG. 4 and taken along line 5—5.

FIGS. 4 and 5 illustrate a fluid bed assembly 112 of the conveyorized electroplating device 110 shown in FIG. 3. The fluid bed assembly 112 comprises a manifold 130, a plurality of baffles 132 and an anode 134. In this embodiment, the manifold 130 is substantially rectangular and defines several receptacle portions 135 each having an inlet 136 and a plurality of stand offs that take the form of rod members 138. The inlets 136 are in fluid communication with a plating solution reservoir 111, as shown in FIG. 3. The plating solution is pumped to the inlets 136 through conduit 101 by pump 109, as shown in FIG. 3. Each of the rod members 138 define a recess (not numbered) for supporting the plurality of baffles 132. The shelf 144 extends inwardly from the vertical walls of the manifold 130 and around the periphery of each of the receptacle portions 135. The shelf 144 acts to redirect the plating solution so that the plating solution exits the anode holes 148 uniformly. Other types of mechanisms that may be used to redirect the plating solution are diffuser cones. The manifold 130 further has a plurality of mounting claws 140 defining holes (not numbered) for mounting the manifold 130 securely onto the housing 108 using any conventional fasteners such as screws. The manifold 130 also has a seal 142 around its periphery at 141 where it is connected to holes 359 located around the periphery of the anode 134 with suitable fasteners such as stainless steel, titanium or plastic screws or a clamping system. The manifold 130 may be made of polyvinylchloride as well as a variety of other materials which will be apparent to one of ordinary skill in the art. The seal 142 may be a hard rubber gasket, a silicone sealer or any other material that is compatible with the fluid bed assembly 112.

The baffles 132 are substantially rectangular members having several pins 145 extending from the top surface of the baffles 132 and defining a second recess (not numbered) for receiving fasteners 143 extending through holes 361 located within the periphery of the anode 134 thus, attaching the anode 134 to the baffles 132. Thus, the baffles 132 are received within the manifold receptacles 135 and are supported by the rod members 138 and are connected to the rod members 138 by fasteners 146 such as stainless steel screws. The baffles 132 may be made from polyvinylchloride as well as a variety of other materials, which will be apparent to one of ordinary skill in the art. Although not illustrated, the shape of the baffles 132 may take a variety of configurations that will be apparent to one of ordinary skill in the art. Also the conveyorized electroplating device of the present invention may be made without baffles 132, as will be described below.

The anode 134 is a planar member having a substantially rectangular shape and a defining plurality of holes 359 and 361 extending through the anode 134. As stated above, fasteners 143 such as stainless steel screws extend through the holes 361 and connect to the pins 145. See FIG. 5. The anode 134 is further supported by the manifold 130 in that the anode 134 rests on the manifold's periphery at 141 and is attached by stainless steel screws being received in holes 359. The anode 134 further comprises slots 148 through which the plating solution passes. The fluid bed assembly 112 attaches to the housing 108 at its mounting claws 140. The fluid bed assembly 112 is positioned such that the anode 134 is in sufficiently close proximity to the absorptive applicator assemblies 116 (FIG. 3) in order to provide a relatively high metallic ion exchange between the anode 134 and the substrate 217. The anode 134 may be titanium, copper, tin, a precious metal, or an inert metal depending on the application.

Figure 6:
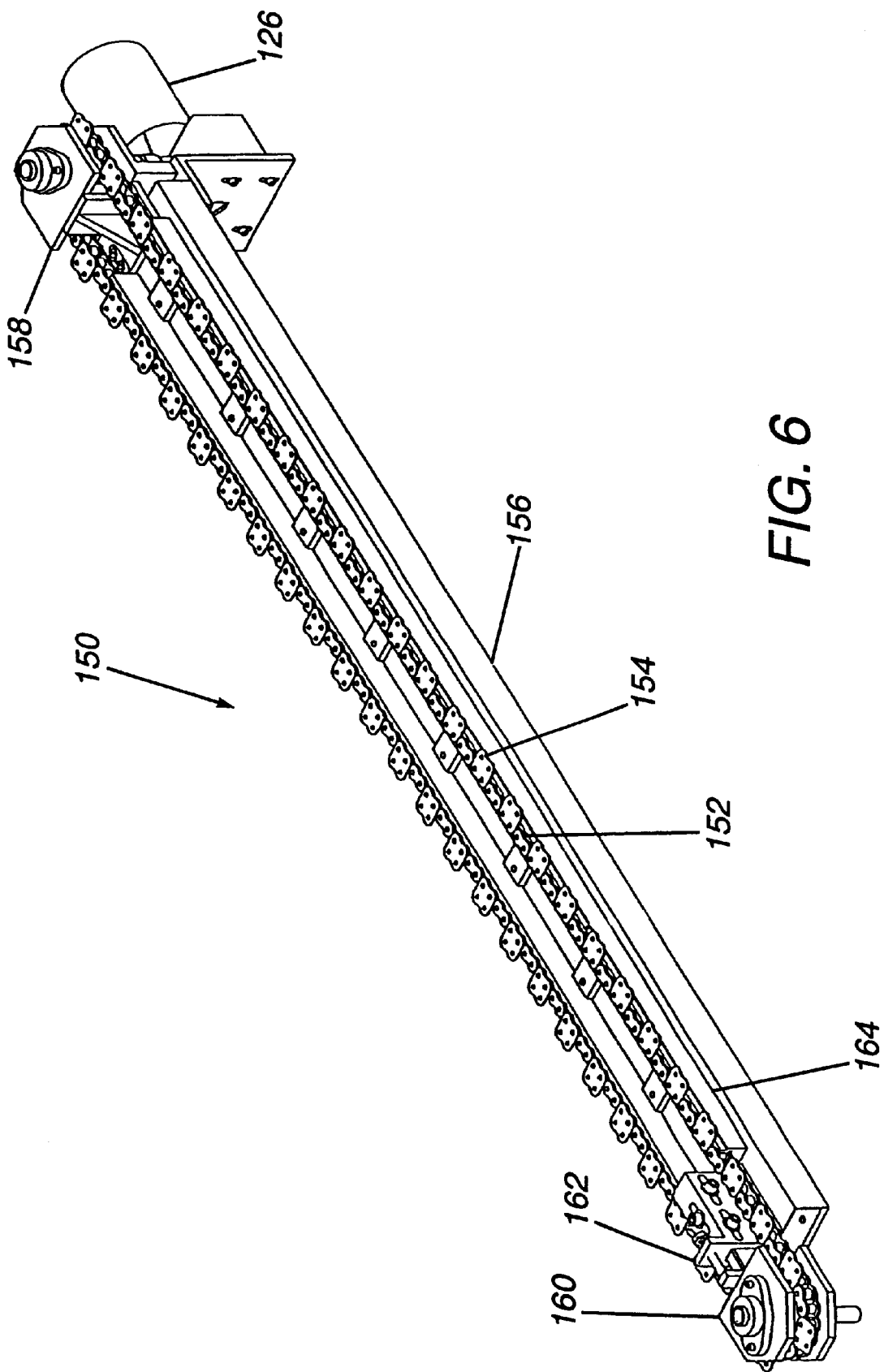
FIG. 6 is a perspective view of a drive assembly of the conveyorized electroplating device of the present invention shown in FIG. 3.

FIG. 6 is a perspective view of a drive assembly 150 of the conveyorized electroplating device 110 shown in FIG. 3, which illustrates part of the conveyor device 114 of the present invention. The drive assembly 150 comprises an actuator in the form of a chain 152 with mounting attachments 154 connected thereto, a drive frame 156, a drive mechanism 158, a driven mechanism 160, a chain tension block 162, chain guides 164 and an actuator drive 126. The chain 152 moves along the length of the drive frame 156 and around the drive mechanism 158 and driven mechanism 160. Mounting attachments 154 attached to the chain 152 are substantially planar members that are rigid and have a somewhat square shape with rounded edges. The drive frame 156 is fixedly attached to the housing 108 by any conventional fastening method. The drive mechanism 158 and the driven mechanism 160 are rotatable. The driven mechanism 160 is rotated by the actuator drive 126 which results in the movement of the chain 152. The chain tension block 162 allows for the tightening or loosening of the chain 152 (i.e., decreasing or increasing the slack in the chain). The chain guides 164 provide that the chain 152 move in a substantially straight path along the length of the drive frame 156. The actuator drive 126 comprises a drive motor 122 and gear box. The drive assembly may alternatively comprise pneumatics, electrical and hydraulic components.

Figure 8:
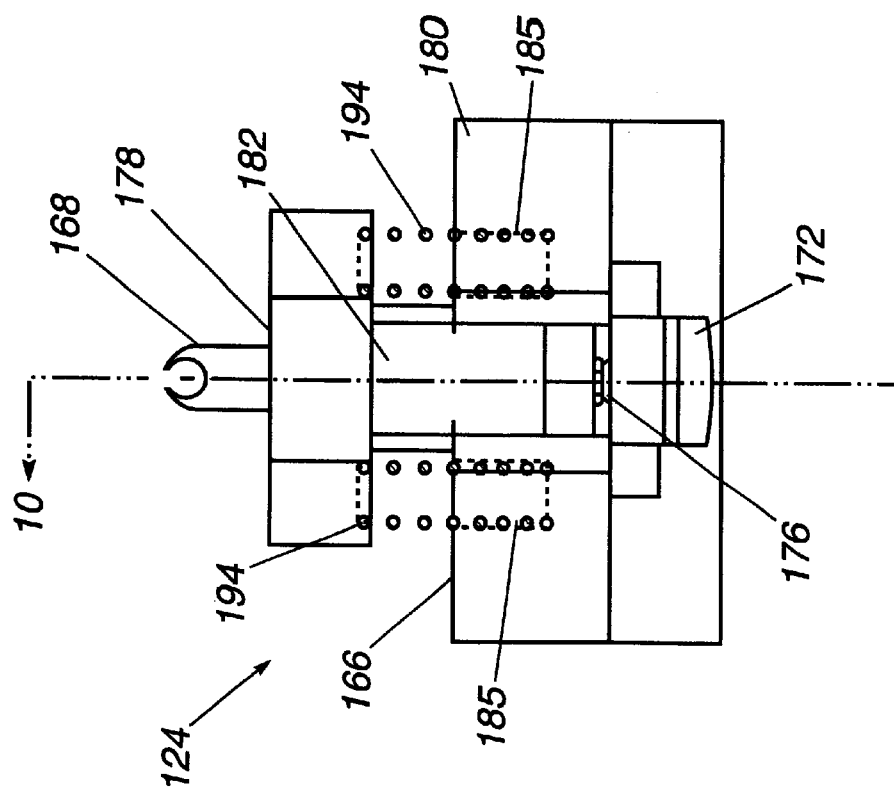
FIG. 8 is a front view of the gripper assembly shown in FIG. 7.
Figure 7:
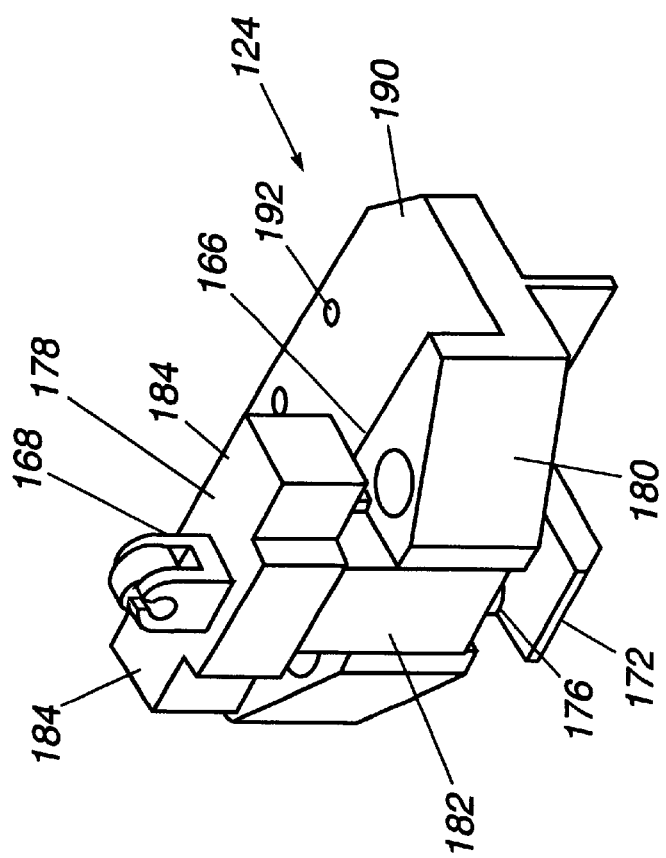
FIG. 7 is a perspective view of a gripper assembly of the conveyorized electroplating device of the present invention shown in FIG. 3.
Figure 9:
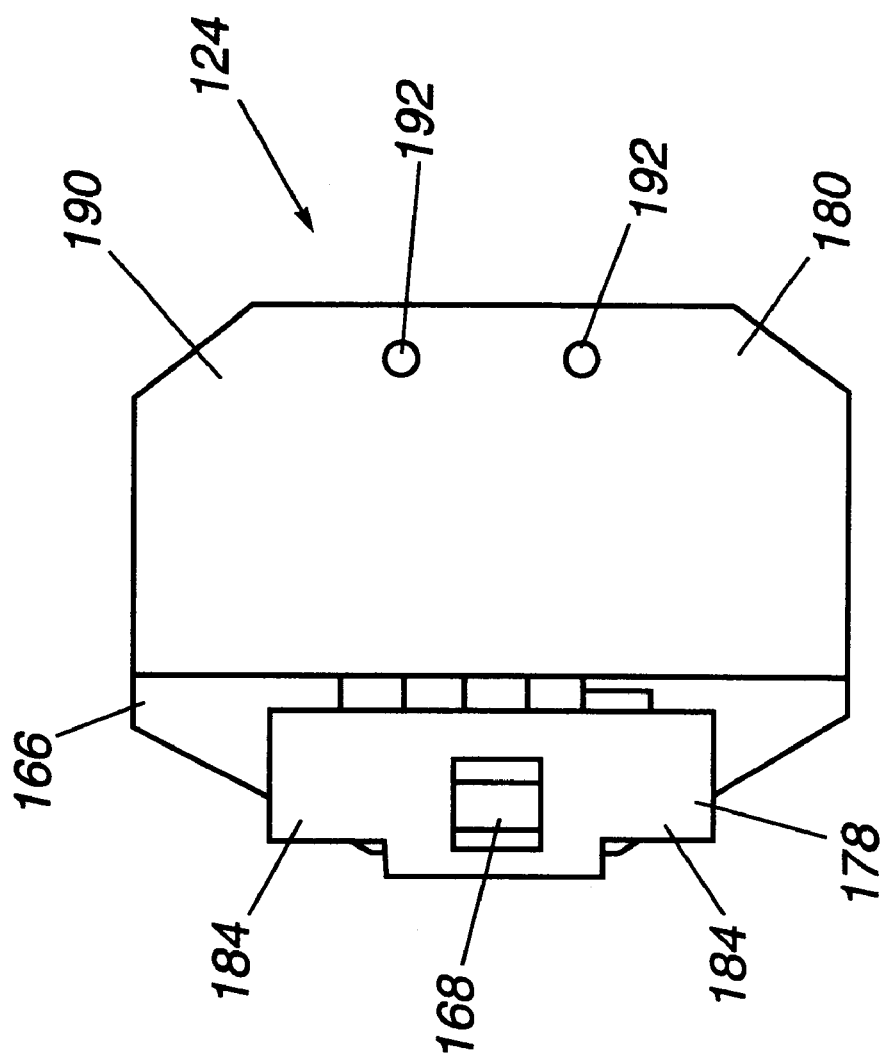
FIG. 9 is a top view of the gripper assembly shown in FIG. 7.

FIGS. 7–10 illustrate one of the gripper assemblies 124 of the conveyorized electroplating device 110 of the present invention shown in FIG. 3. The gripper assembly 124 comprises a non-metallic housing 166, a metallic member 168, a pivotable panel support 172 which takes the form of an arm, and a seal 176. The non-metallic housing 166 comprises a T-shaped member 178 and a second member 180 (FIGS. 7 and 8). The T-shaped member 178 has a trunk 182 and two branches 184 extending substantially perpendicular from the trunk 182. The trunk 182 is a substantially elongated rectangular member and has a cavity 186 therein (FIG. 10). The cavity 186 slidably receives the metallic member 168. The second member 180 of the housing 180 also defines a passage 170 which receives the trunk 182 of the T-shaped member 178. The second member 180 further defines a mounting portion 190 having a plurality of holes 192, shown in hidden lines in FIGS. 10A–10D. The mounting portion 190 is connected to the mounting attachments 154 by stainless steel screws or other appropriate fasteners. A housing biasing member 194 extends between each branch 184 of the T-shaped member 178 and the second member 180 of the housing 166 (FIG. 8) and are received within cavities 185 (shown in hidden lines) of the second member 180 of the housing 166. The housing 166 may be made of a variety of non-metallic materials such as polypropylene or polyethylene as well as any other non-metallic materials that are compatible with plating solution and the operating temperature of the electroplating device of the present invention that will be apparent to one of ordinary skill in the art. The housing biasing members 194 may be coil springs; however, other biasing members can also be used as will be apparent to one of ordinary skill in the art.

Referring to FIGS. 10A through 10D, the metallic member 168 comprises a first contact 197, a second contact 199, a first biasing member 200, a second biasing member 202, flexible contact wire 204 and a roller 206. The contact wire 204 may also take the form of a braided or multi-stranded wire. The first contact 197 is a substantially elongated rectangular member having the roller 206 rotatably connected thereto by a set screw 208 such that the set screw 208 transverses the longitudinal axis of the first contact 197. The first contact 197 also defines an opening 198. The second contact 199 is a substantially elongated rectangular member, defining an opening 210 therein, and having an extension 212 extending therefrom and through an opening 214 in the T-shaped member. The first biasing member 200 is between the first and second contacts 197 and 199. The contact wire 204 is connected to and extends between the first contact 197 and the second contact 199. The contact wire 204 is attached to the first and second contacts 197 and 199 by set screws 218. The second biasing member 202 is positioned at the base of the cavity 186. The first and second biasing members 200 and 202 may be coil springs; however, a variety of other biasing members can be used which will be apparent to one of ordinary skill in the art. The first and second biasing members 200 and 202 have a greater stiffness than the stiffness of the housing biasing members 194. The first and second contacts 197 and 199, the first and second biasing members 200 and 202, contact wire 204 and the roller 206, may be made form a variety of metallic materials such that electrical current will be easily conducted therethrough.

The pivotable panel support 172 is a substantially L-shaped arm member having one leg thereof pivotally connected to the housing 166 by a pin 213 and the other leg of the L-shaped member free to swing in an arc and thus form a passageway 174 with the housing 166.

Figure 10A:
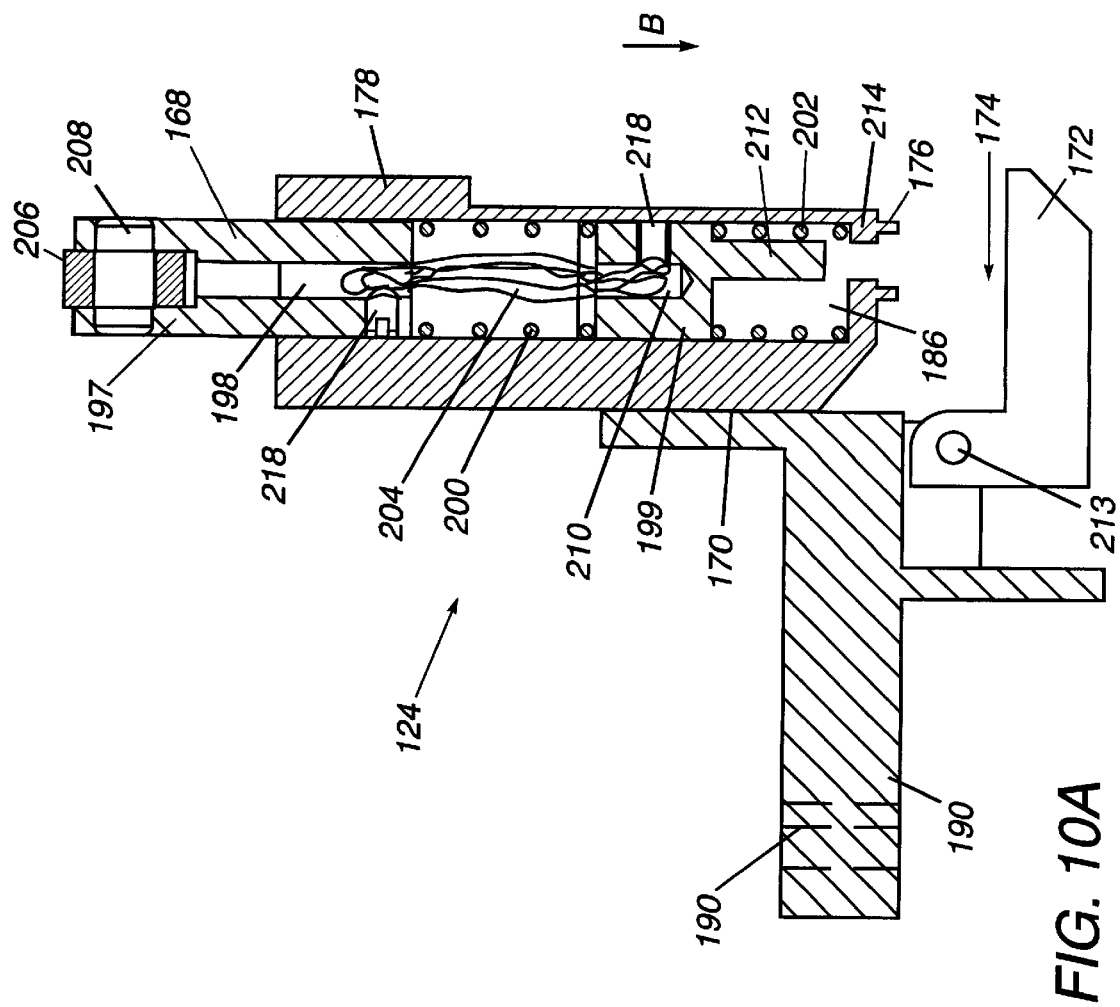
FIG. 10A is a sectional view of the gripper assembly shown in FIG. 8 and taken along line 10—10, wherein the extension is in the unengaged position and no substrate is being gripped.
Figure 10B:
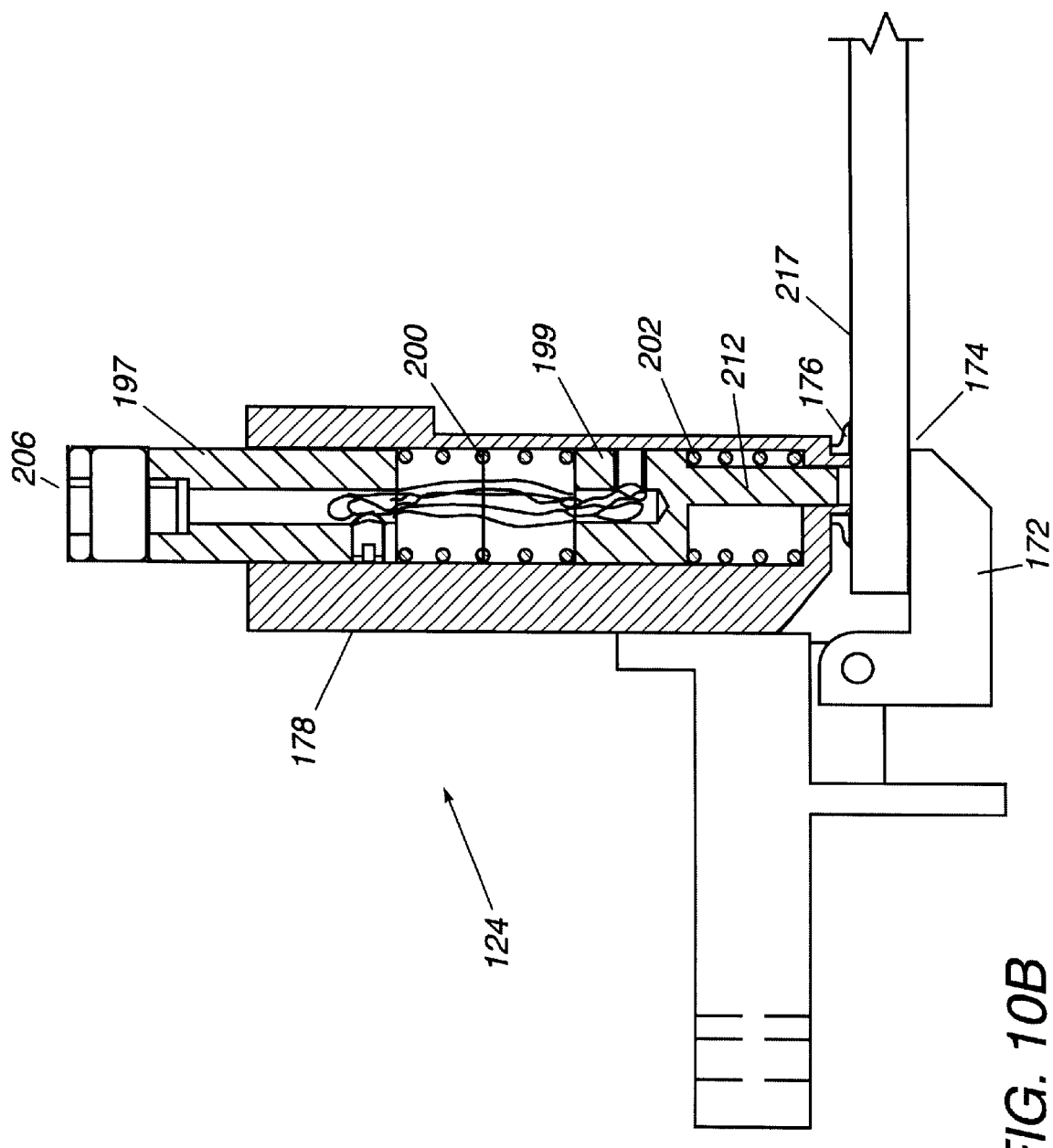
FIG. 10B is another sectional view of the gripper assembly, wherein the extension is in the intermediate position and a substrate is being gripped.
Figure 10C:
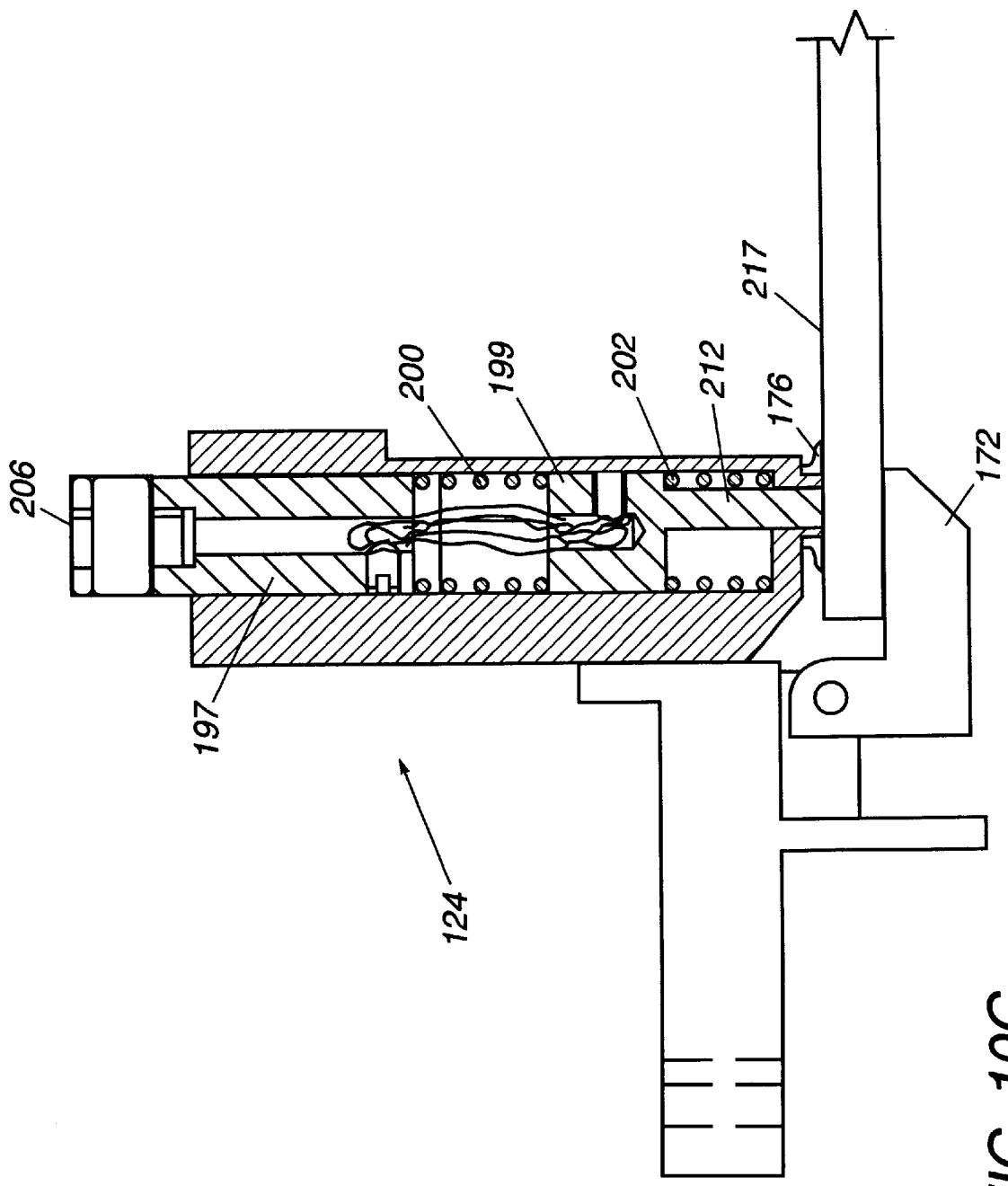
FIG. 10C is another sectional view of the gripper assembly, wherein the extension is in the fully engaged position and a substrate is being gripped.
Figure 10D:
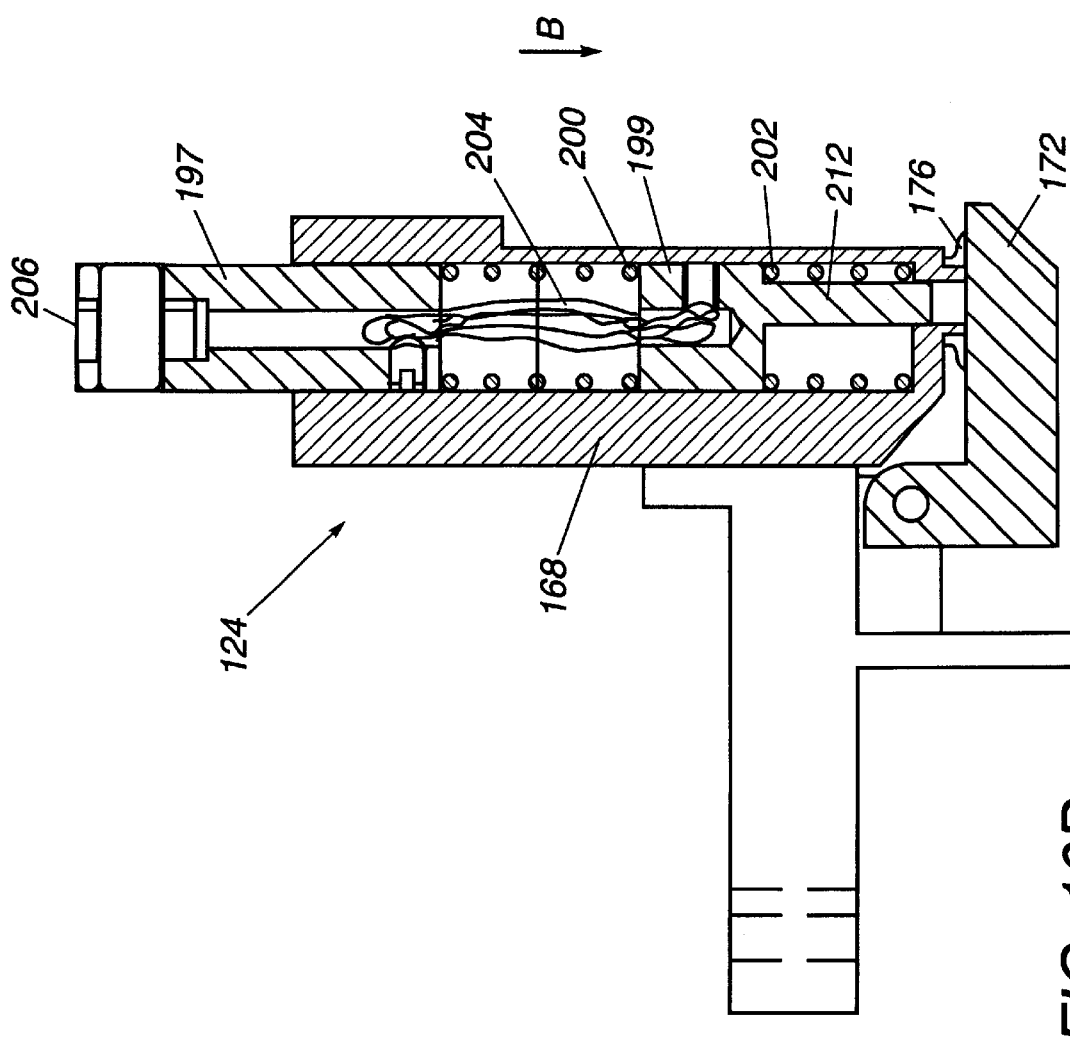
FIG. 10D is another sectional view of the gripper assembly, wherein the extension is in the intermediate position and no substrate is being gripped.

The seal 176 is attached to the exterior of the trunk 178 and adjacent the pivotable panel support 172 by any conventional fasteners such as adhesive, pins, or clips. The seal 176 is a conical compressive seal fabricated from, for example, EDPM such that after the seal 176 is compressed (FIGS: 10B, 10C and 10D), the seal 176 will spring back to its original form (FIG. 10A). The length of the free leg of the pivotable panel support 172 is sized such that when the pivotable panel support 172 is pivoted about pin 213 toward the seal 176, the seal 176 forms a fluid tight seal therewith (FIG. 10D).

Figure 11:
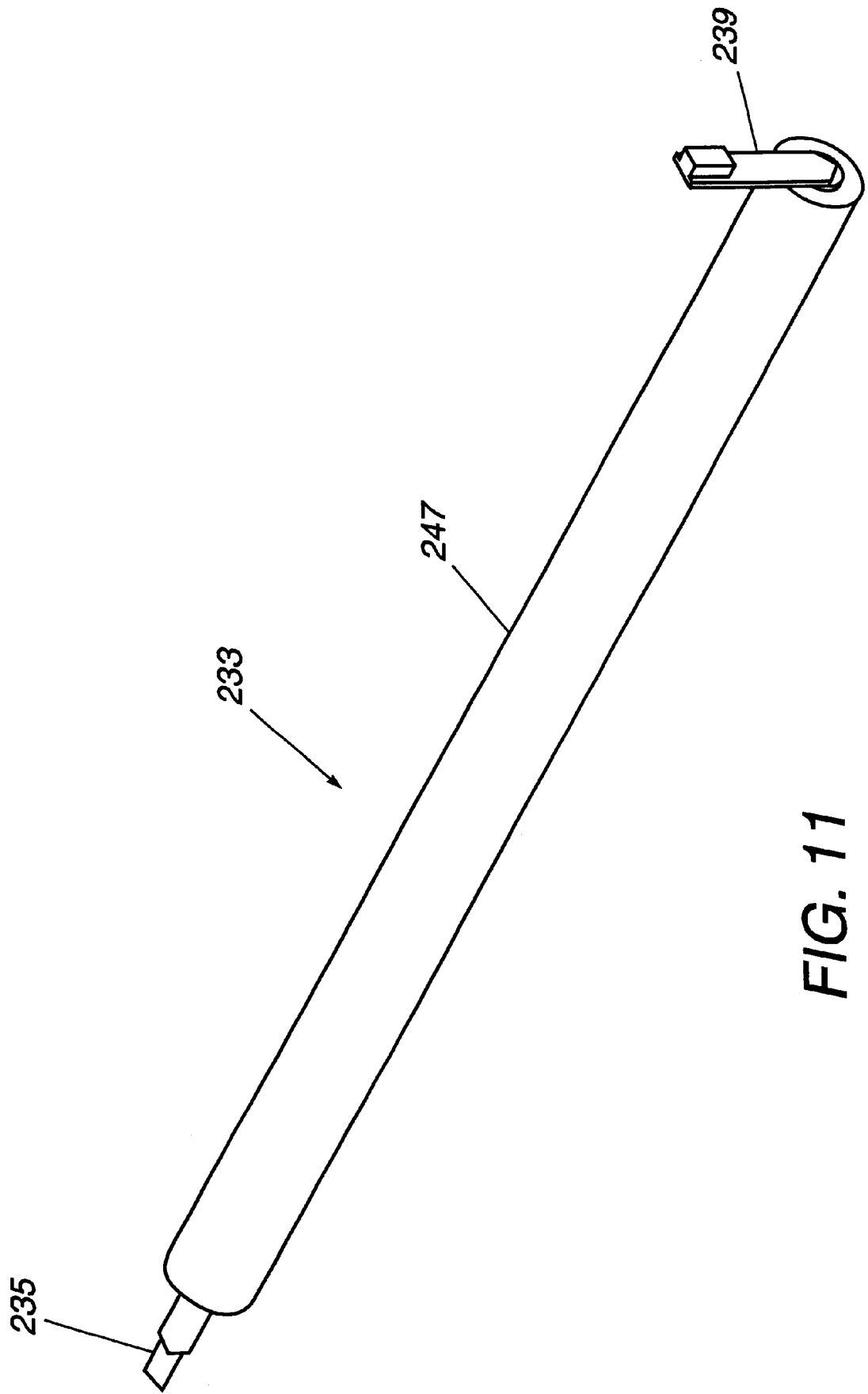
FIG. 11 is a perspective view of an upper roller assembly of the conveyorized electroplating device of the present invention shown in FIG. 3.
Figure 12:
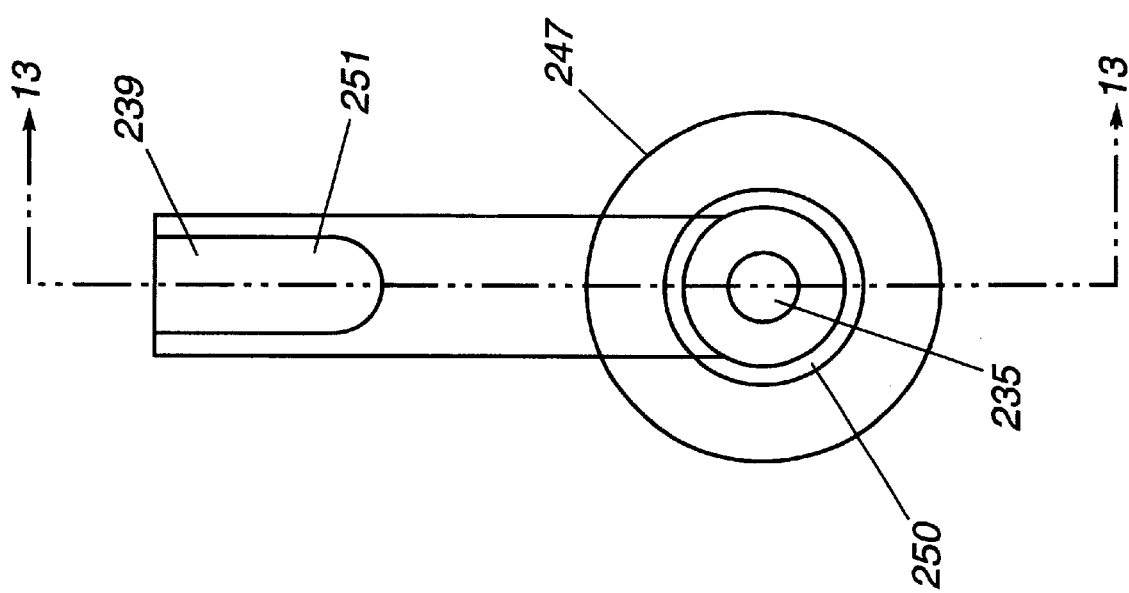
FIG. 12 is a right side view of the upper roller assembly shown in FIG. 11.
Figure 13:
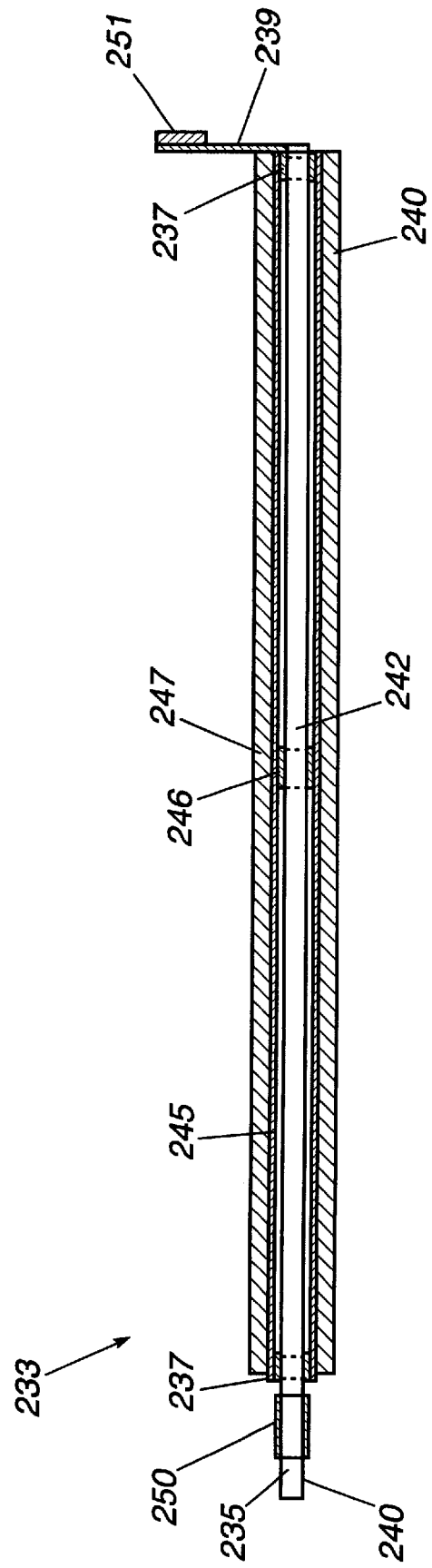
FIG. 13 is a longitudinal sectional view of the upper roller assembly shown in FIG. 12 and taken along line 13—13.

The absorptive applicator assemblies 116 take the form of upper roller assemblies 233 and lower roller assemblies 253. FIGS. 11–13 illustrate an upper roller assembly 233. Each of the upper roller assemblies 233 may comprise a solid shaft 235 or hollow shaft (not shown) that has a roll bushing 237 pressed thereon at each of its end portions 240. Another shaft bushing 246 is pressed onto the intermediate portion 242 of the shaft 235. As can be seen in FIG. 13, bushings 237 and 246 are received within a liner 245 that is pressed into an elongated roller 247. It will be appreciated that bushings 237 and 246 rotatably support solid shaft 235 within liner 245. An upper roller assembly 233 further comprises a bushing 250 pressed onto the shaft 235 at one of the end portions 240. A flange member 239 is pressed onto the other end of the solid shaft 235 and extends perpendicular thereto. The flange member 239 further includes a projection 251 which is supported by the bearing blocks 121 and prevents the solid shaft 235 from rotating. The shaft 235 and the bushings 237, 246 and 250 are rotatably received within the roller 247 and the liner 245 such that the roller 247 can rotate relative to the shaft 235. The elongated roller 247 may be made of a woven mesh made from polypropylene, polyethylene or polyvinyl alcohol; however, a variety of materials can be used for the roller 247 as will be apparent to one of ordinary skill in the art. The shaft 235 may be made of polyvinylchloride; however, it will be apparent to one of ordinary skill that other materials may be used as well. Bushings 237, 246 and 250 may be made of polypropylene; however, any material having suitable mechanical and chemical properties could also be used for the bushings 237, 246 and 250. The shaft 235 is supported at its end portions 240 to the bearing block 121 wherein the solid shaft 235 and the flange member 239 are received within recesses of the bearing blocks 121, shown in FIG. 3.

Figure 14:
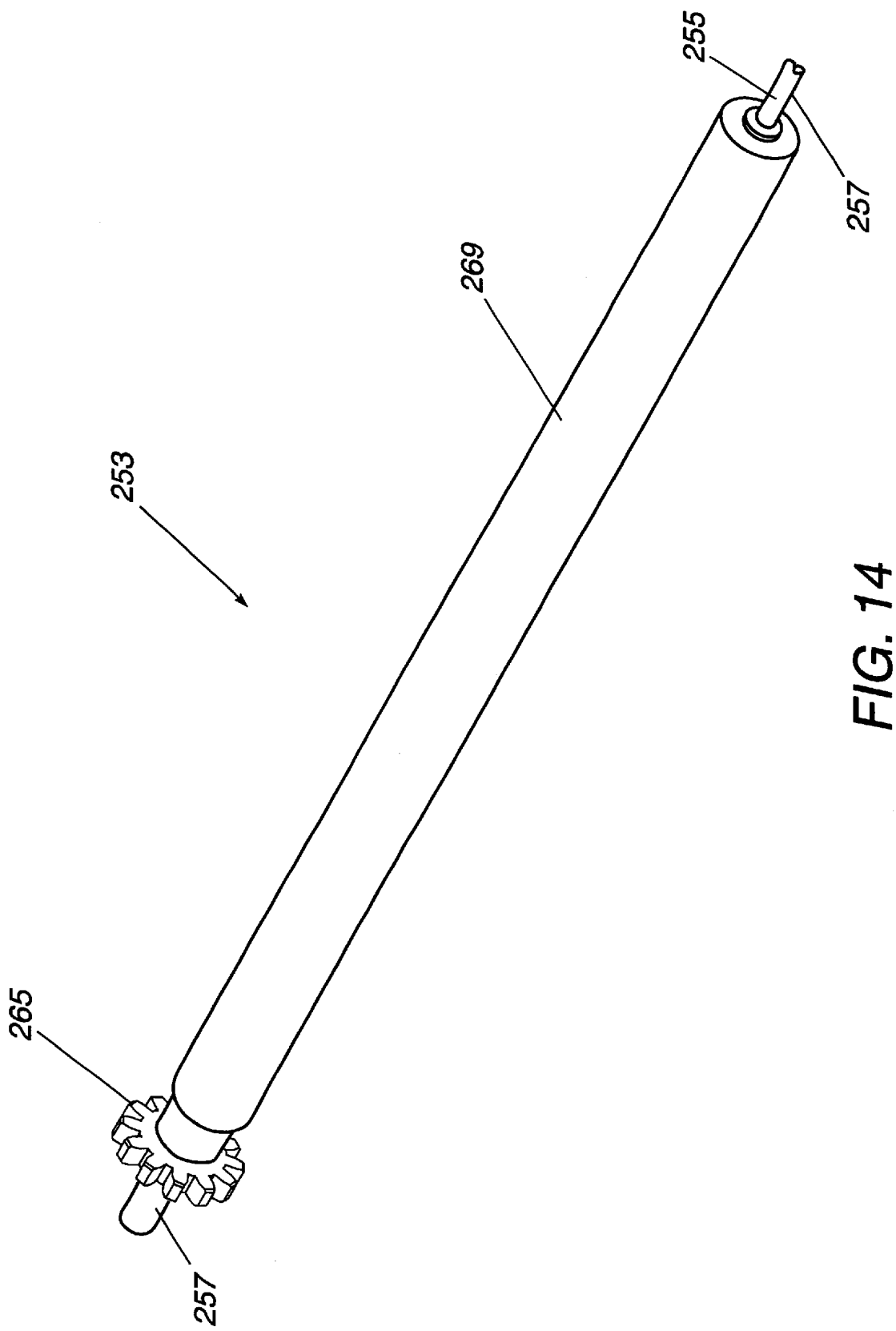
FIG. 14 is a perspective view of the lower roller assembly of the conveyorized electroplating device shown in FIG. 3.
Figure 15:
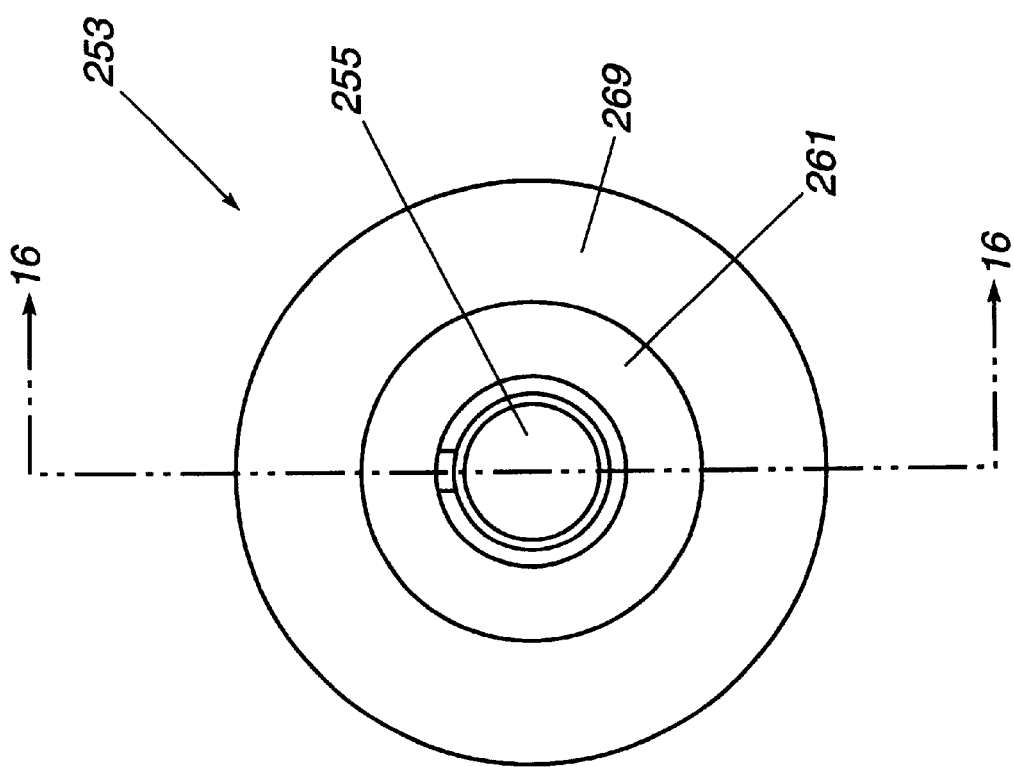
FIG. 15 is a right side view of the lower roller assembly shown in FIG. 14.
Figure 16:
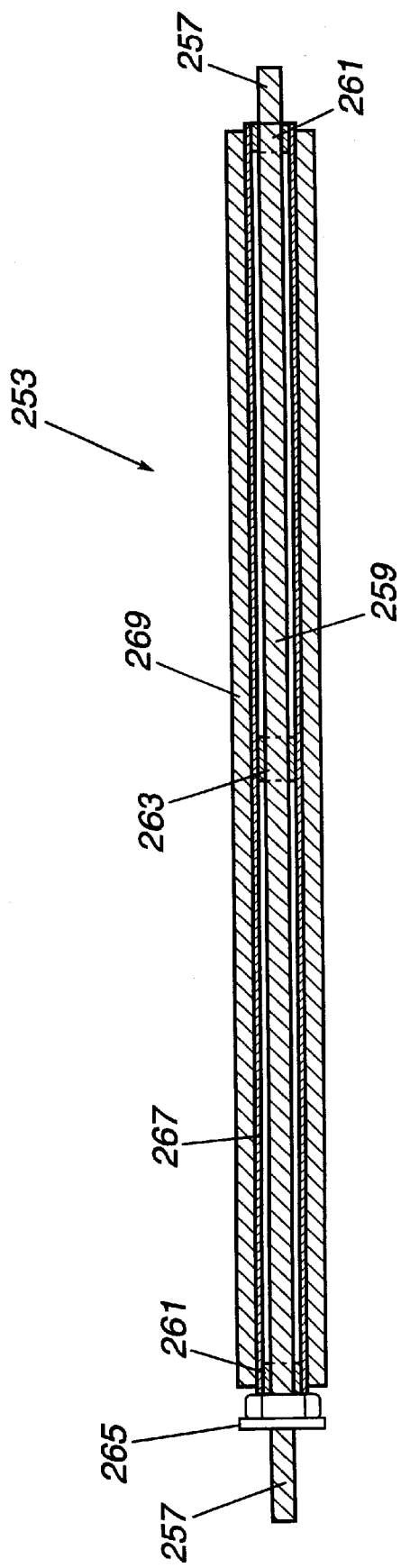
FIG. 16 is a longitudinal sectional view of the lower roller assembly shown in FIG. 15 and taken along line 16—16.

FIGS. 14–16 illustrate a lower roller assembly 253 of the conveyorized electroplating device 110 shown in FIG. 3. A lower roller assembly 253 may include a solid shaft 255, two roll bushings 261, a shaft bushing 263, a sprocket 265, a liner 267, and a roller 269. The solid shaft 255 has two end portions 257 and an intermediate portion 259. The roll bushings 261 are pressed onto the two end portions 257 of the shaft 255. Similarly, the shaft bushing 263 is pressed onto the intermediate portion 259. The sprocket 265 is pressed onto one end portion 257. A liner 267 is pressed into a coaxial passage in roller 269 and is rotatably supported on the bushings 263 and 261. The roller 269 may be made from woven mesh of polypropylene, polyethylene or polyvinyl alcohol or a variety of other materials apparent to one of ordinary skill in the art. The shaft 255, the liner 267, and the bushings 263 and 261 also may be made of the materials for the like parts stated above. The end portions 257 of the shaft 255 are received within recesses in the bearing block 121 (FIG. 3) and the sprocket 265 is engaged and rotated by a chain (not shown) to drive lower roller assemblies 253. However, other conventional drive mechanisms can be used to drive the lower roller assemblies 253. The chain is driven by a lower roller drive assembly 128. The lower roller drive assembly 128 may be a DC motor, an AC motor, a stepper motor or a servo motor.

Figure 17:
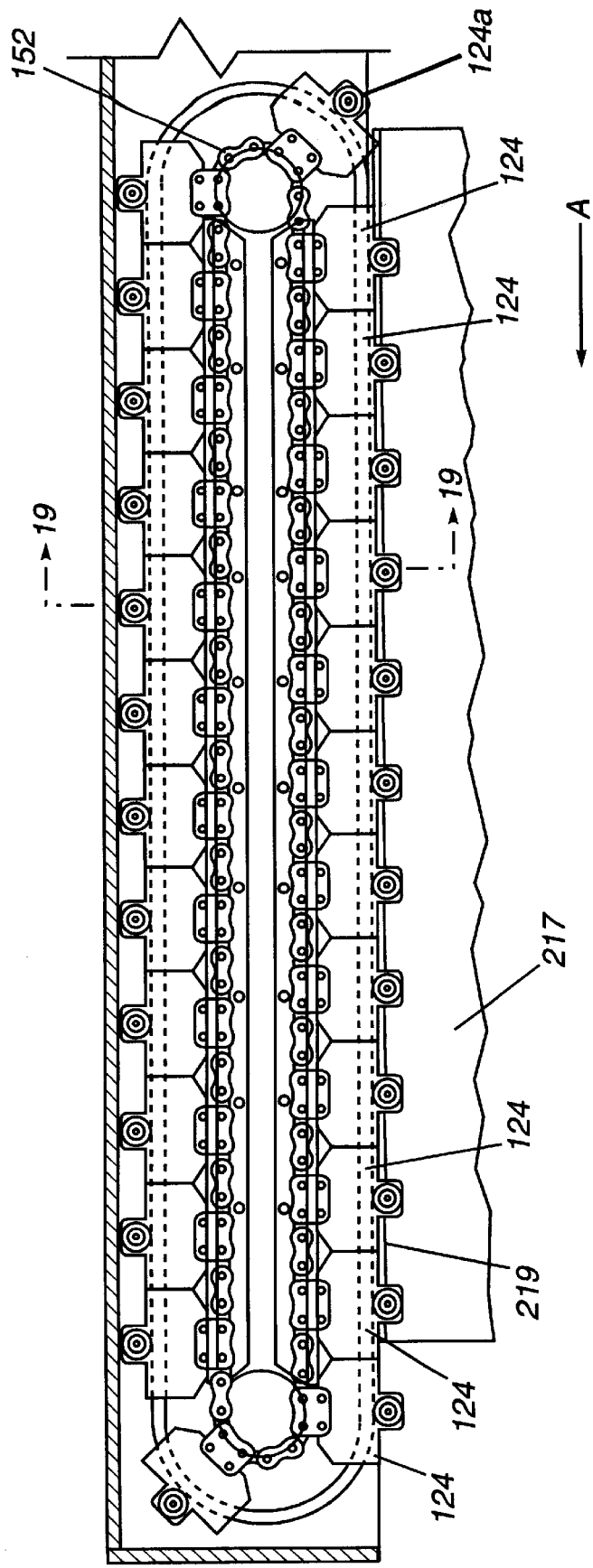
FIG. 17 is a diagrammatical top view of the drive assembly and gripper assemblies of the conveyorized electroplating device of the present invention shown in FIG. 3.
Figure 18:
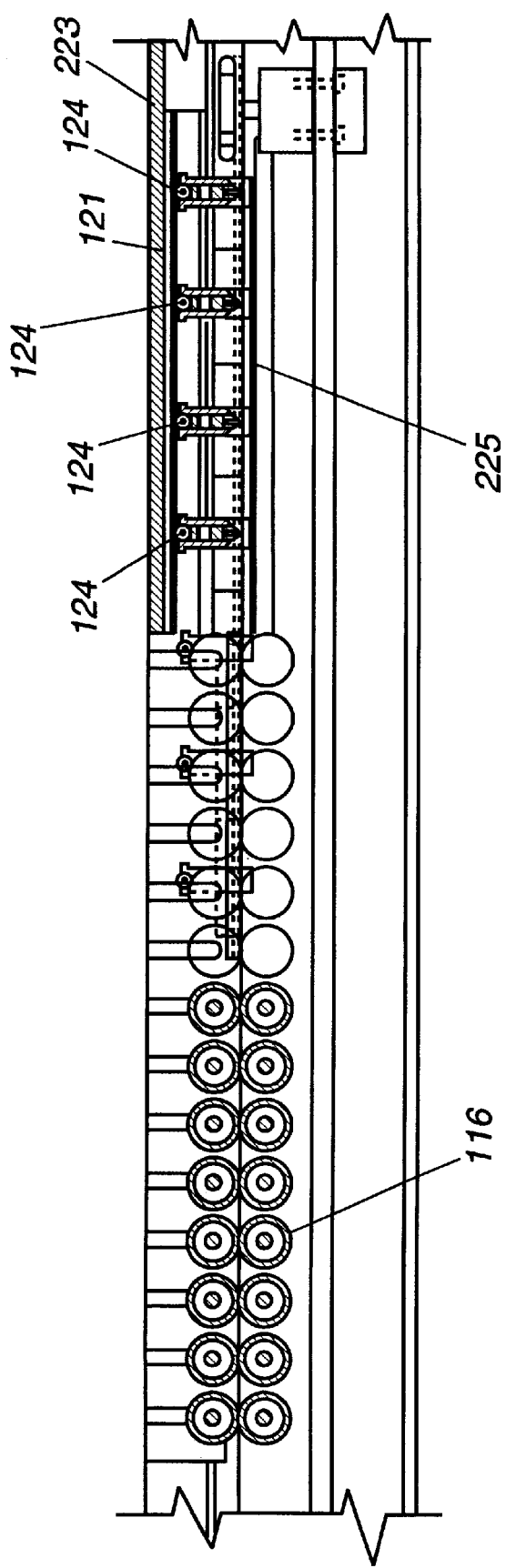
FIG. 18 is a diagrammatical multiple layer sectional view of the conveyorized electroplating device of the present invention shown in FIG. 3.
Figure 19A:
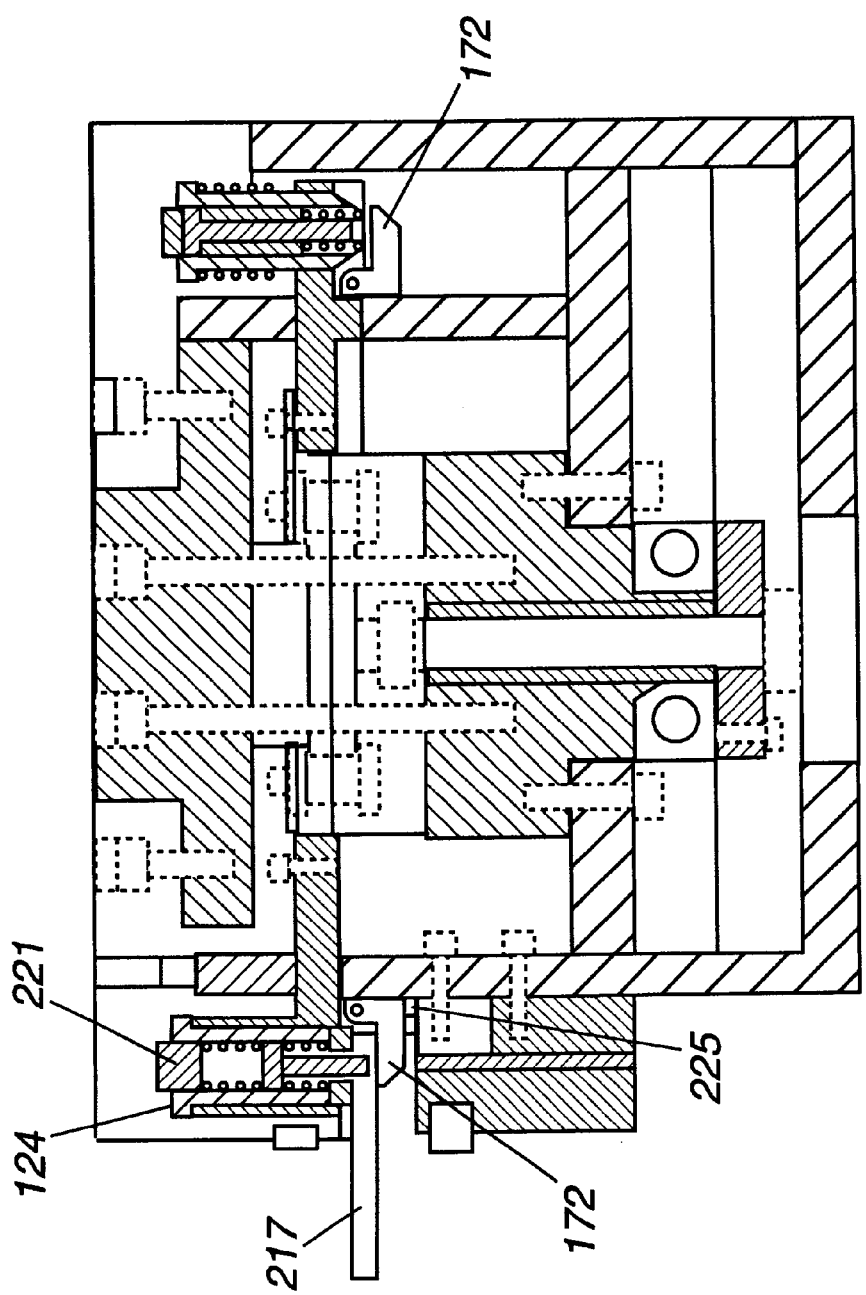
FIG. 19A is a diagrammatical sectional view of the drive assembly and gripper assemblies of the present invention shown in FIG. 17 and taken along line 19—19.
Figure 20:
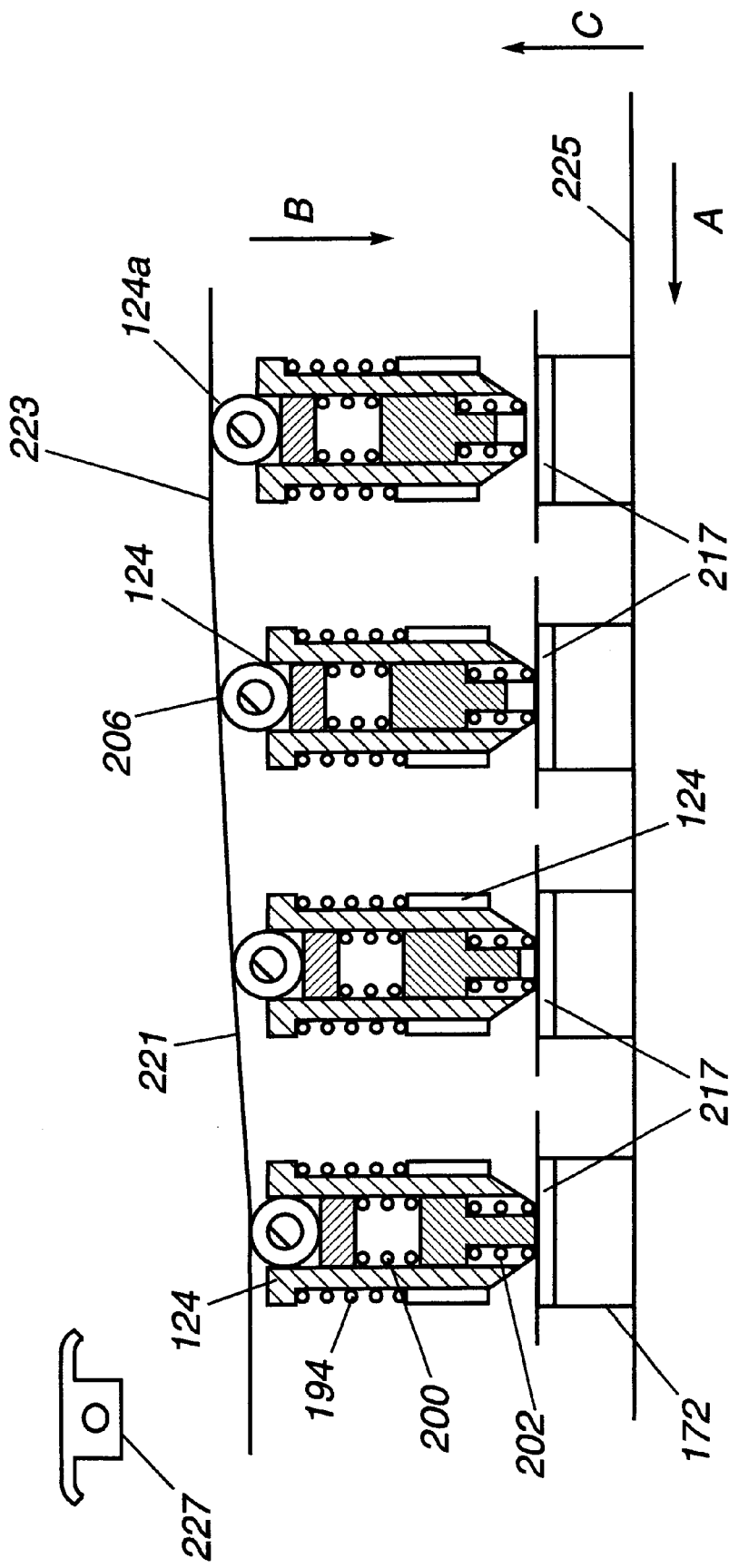
FIG. 20 is a sectional view of the gripper assemblies illustrating the movement of the gripper assemblies during the process of plating the substrate and also illustrating an alternative embodiment of the first contact.

FIG. 17 is a top view of a drive assembly 150 and gripper assemblies 124. FIG. 18 is a multiple layer longitudinal sectional view of the drive assembly 150 and gripper assemblies 124 shown in FIG. 17. FIG. 19A is a horizontal sectional view of the drive assembly 150 and gripper assemblies 124 of the present invention shown in FIG. 17 and taken along line 19—19 in FIG. 17. FIG. 20 is a sectional view of the gripper assemblies 124 illustrating the movement of the gripper assemblies 124 when the substrate 217 is being fed through the conveyorized electroplating device 110. In FIGS. 18, 19A and 20, the gripper assemblies 124 are illustrated as a simplified form for clarity. In operation, a circuit board substrate 217 is inserted into the conveyorized device 110 at the input station 104 (shown in FIG. 1), fed onto the track 119 of one of the modules 102 (shown in FIG. 3) and is gripped along the length of one of its edges 219 by the gripper assembly 124 (FIGS. 17, 18, 19A and 20). As shown in FIG. 17, as the gripper assemblies 124a round the corner of the drive assembly 150, the substrate 217 is gripped by the gripper assembly 124a and is carried in direction A due to the motion of the chain 152. As the gripper assembly 124a is about to turn at the opposing end of the drive frame 156 following the path of the chain 152, the gripper assembly 124a will release the substrate 217 having carried the substrate 217 the length of the drive frame 156.

Referring to FIGS. 18 and 20, for the pivotable panel support 172 of the gripper assembly to grasp the circuit board substrate 217, the roller 206 engages a ramp 223 which is inclined in the downward direction B (FIG. 20). The ramp 223 is a bus bar 221. As the gripper assembly 124 moves further in the direction A, the ramp 223 forces the roller 206 in direction B, which results in the T-shaped member 178 exerting a force on the housing biasing members 194 and being compressed in a direction B (see FIGS. 8, 10B, 10C and 10D). FIG. 10A illustrates the gripper assembly 124 before it engages the ramp 223. When the gripper assembly engages ramp 223 and even before a substrate 217 enters passageway 174 the seal 176 engages the arm member 172. (FIG. 10D). The housing biasing members 194 will compress before the first and second biasing members 200 and 202 because the housing biasing members 194 are weaker. As the ramp 223 (FIG. 20) further increases in a downward direction B, the force exerted on the roller 206 (FIGS. 8, 10B, 10C and 10D) compresses the first and second biasing members 200 and 202, resulting in the extension 212 moving from an unengaged position without a substrate 217 (FIG. 10D), to an intermediate position (FIG. 10B) to a fully engaged position (10C), wherein the extension 212 extends from opening 214 and makes contact with the substrate 217 which is received within passageway 174 (FIG. 10C). Because the housing springs 194 are less stiff than the first and second biasing member 200 and 202, the T-shaped member 178 will be compressed in direction B initially. Having the two different strength springs allows for the T-shaped member 178 to move in direction B resulting in the seal 176, engaging the arm member 172 and the extension member 212 to remain within cavity 186 and thus, be protected from the plating solution until the substrate 217 is received within passageway 174 at which time the substrate 217 will engage the seal 176 (FIG. 10C) and thus isolate extension 212 from the plating solution. The extension 212 is in the unengaged position (FIG. 10A) when no force has been applied to the housing biasing members 194 on the first and second biasing members 200 and 202. The extension is an unengaged position without a substrate when the roller engages the ramp 223 but no substrate 217 is present in the passageway 174 (FIG. 10D). The extension 212 is in the intermediate position (FIG. 10B), when the housing biasing members 194 are being compressed. The extension is in the engaged position when it is extending from the opening 214 (FIG. 10C).

At the same time that rollers 206 of the gripper assemblies 124 are engaging the ramp 223, the pivotable panel support 172 is riding across ledge 225 such that the ledge 225 supports the pivotable panel support 172 in the C direction. See FIG. 20. Furthermore, when the roller contacts the ramp 223, which is a bus bar 221, electricity is supplied to the roller 206. The electricity flows through the metallic roller 206, through the first contact 197, through the contact wire 204, through the second contact 199 and through the extension 212. When the extension 212 contacts the substrate 217, the substrate is then electrified. While the gripper assemblies are gripping the substrate, moving it in direction A and electrifying the substrate, the plating solution is being pumped through the fluid bed assembly 112 from plating reservoir 111 (FIGS. 3–5). The plating solution enters inlet 136 and is diffused by the baffles 132 and forced through the electrified anode slots 148 where it then is applied to the upper roller assemblies 233 which are in contact with the substrate 217 and is transferred thereby to the substrate 217 which is in contact with the upper roller assemblies 233. Both a DC current electroplating method may be used to plate the substrate or a pulse plating method may be used. One example of a pulse plating system that may be used is manufactured by Chemring Plating Systems of Kennett Square, Pa. 19348. The baffles 132 forces the plating solution to be evenly distributed along the anode 134 and exiting the anode evenly along the surface thereof. Without the baffles 132, the plating solution would enter the inlet 136 and move directly to the closest holes 148 thus exiting the anode 134 at concentrated areas.

Figure 19B:
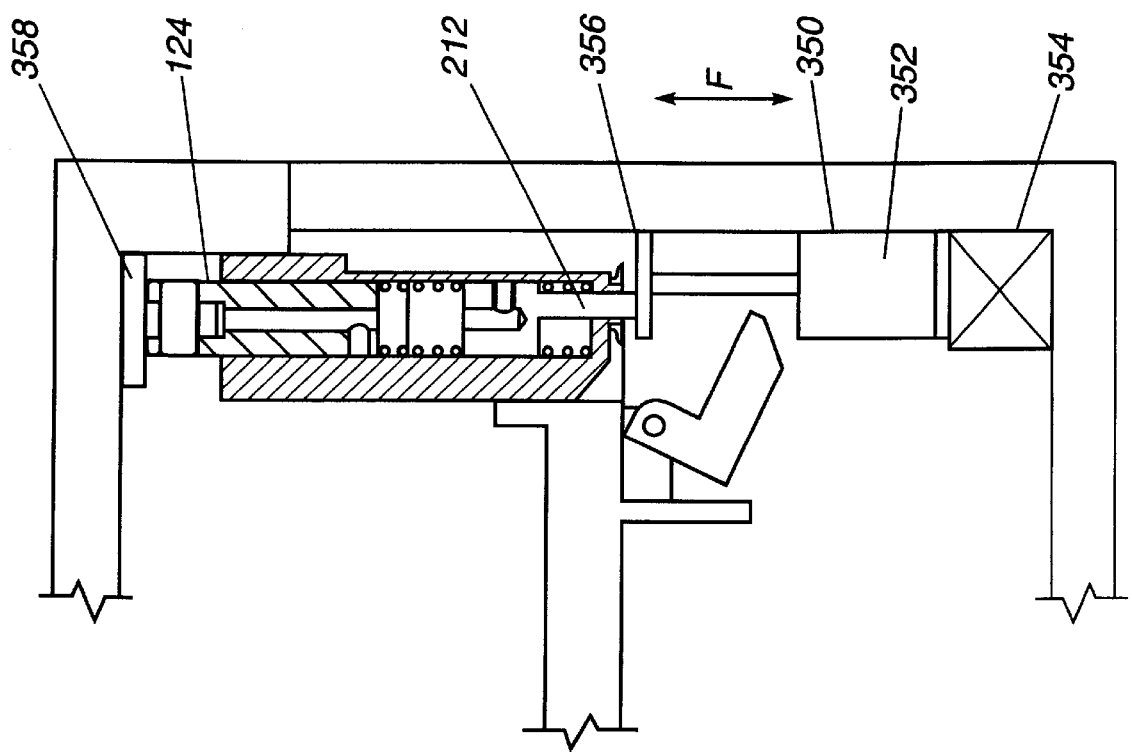
FIG. 19B is a diagrammatical sectional view of another embodiment of the drive assembly and gripper assembly of the present invention having a cleaning device.

FIG. 19B is a diagrammatical sectional view of another embodiment of the drive assembly and gripper assembly having a cleaning device 350 for the extension 212, which is the electrical contact. The cleaning device 350 comprises an abrasive disk 356, a motor 352 and a spring loaded vertical actuator 354. The abrasive disk 356 can be substantially comprised of a diamond dust mounted on a structure; however, many other abrasive surfaces may be used. The motor 352 may be an electrical motor, a pneumatic motor or other types of motors apparent to one of ordinary skill in the art. The spring loaded vertical actuator 354 may be a coil spring or other members that will absorb the downward force of the device 350. The cleaning device is mounted on the return pass of the drive assembly 150. As the gripper assembly 124 rides along the ramp 358, the extension 212 is forced passed the seal 176 while at the same time the abrasive disk 356 is moved into contact in the direction F with the extension 212 by the spring loaded vertical actuator 354. This contact results in the removal of unwanted plating or oxidation from the extension 212.

This embodiment of the present invention places a relatively large amount of absorptive applicator assemblies 116 in contact with the substrate 217 and both the assemblies 116 and the substrate 217 in close proximity with the anode 134 which results in a high metallic ion exchange. Furthermore, the relatively large number of assemblies 116 in contact with the substrate provides for the desired plating of holes and/or openings in the substrate 217.

As can be seen in FIG. 20, a ski-shaped device 227 can be substituted for the roller 206. The ski-shaped device 227 can be made of a variety of metallic materials such as copper.

Figure 21:
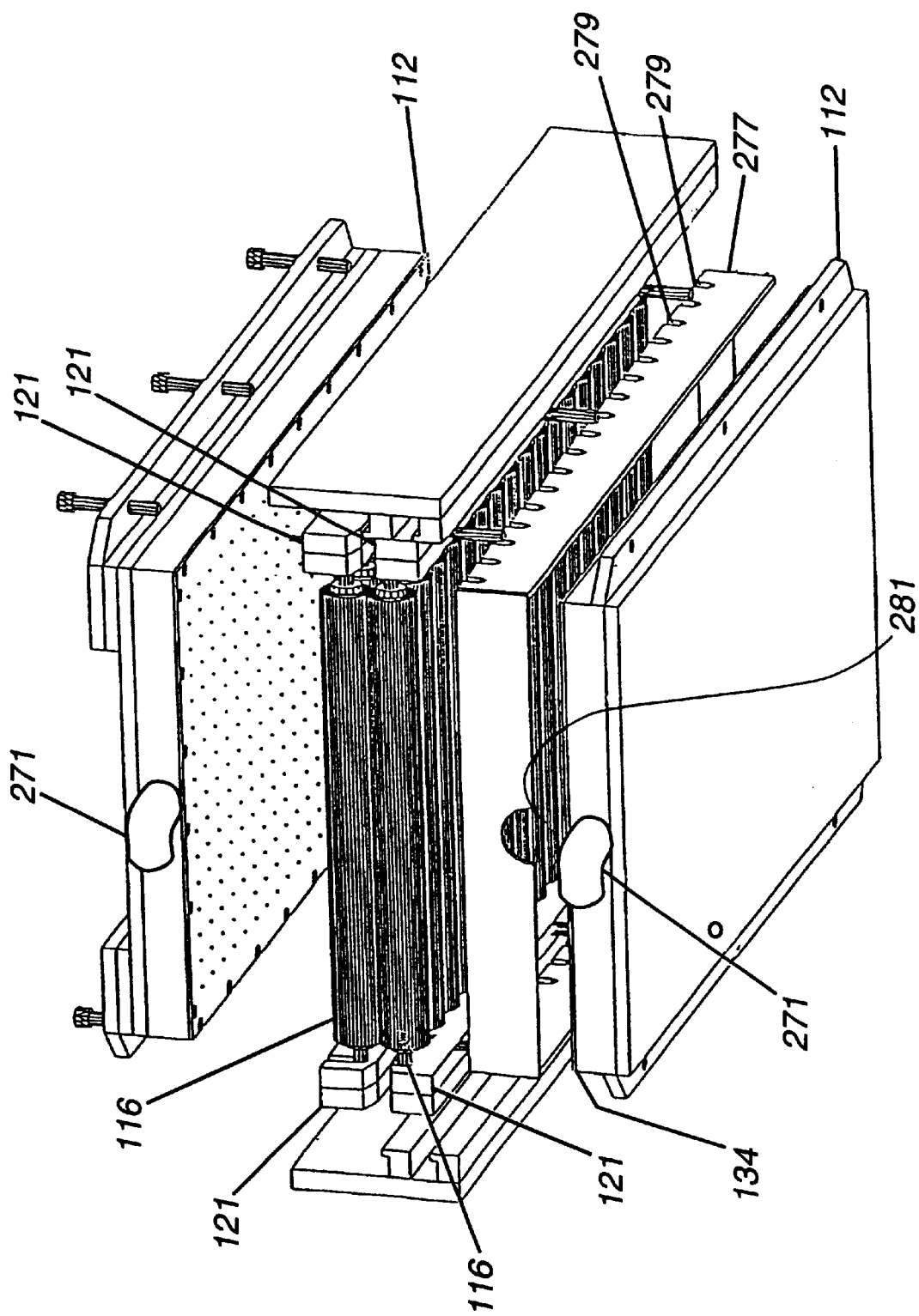
FIG. 21 is an exploded perspective view of another embodiment of the conveyorized electroplating device of the present invention.
Figure 22:
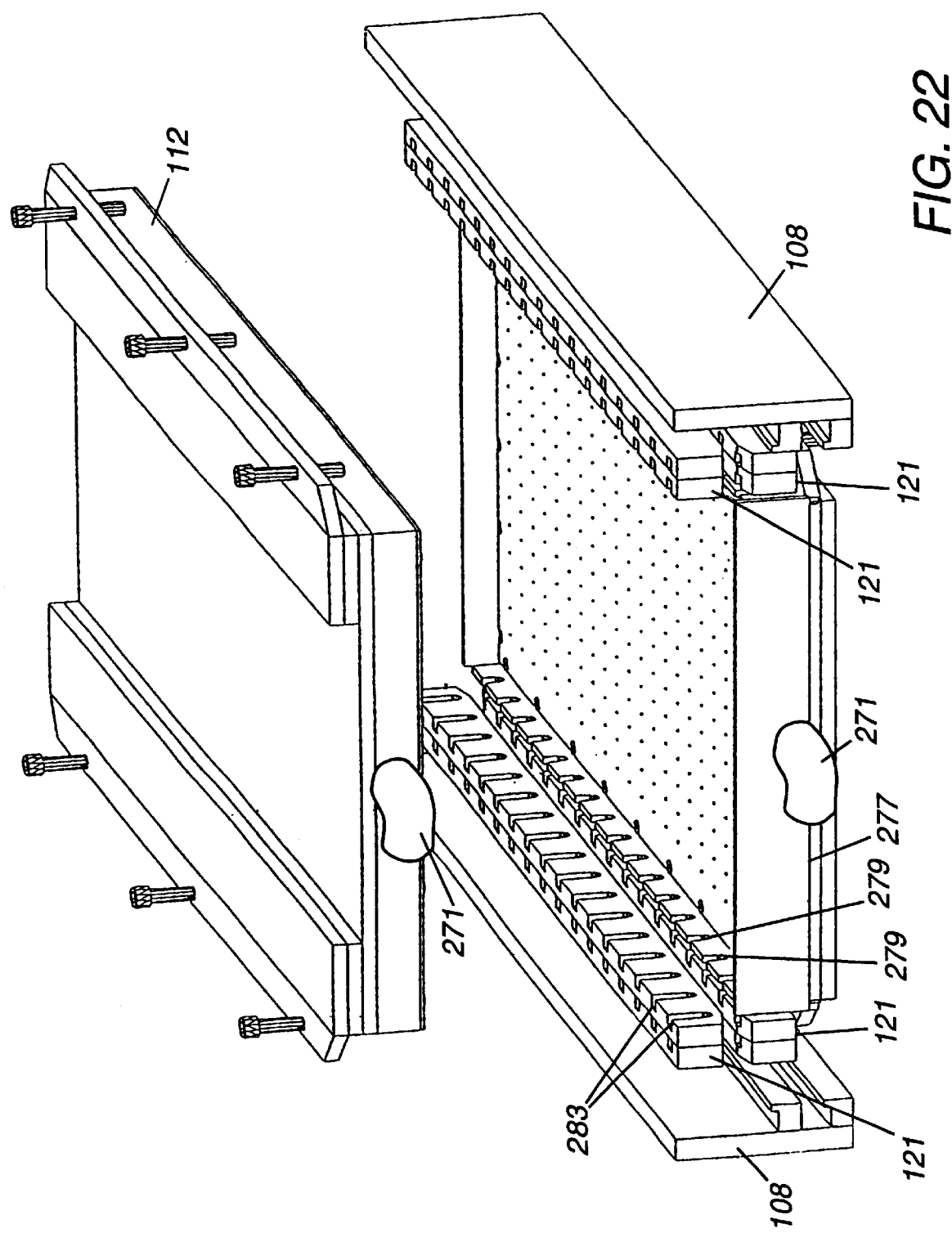
FIG. 22 is another exploded perspective view of the conveyorized electroplating device of the present invention shown in FIG. 21, wherein the absorptive applicator assemblies have been removed.
Figure 23:
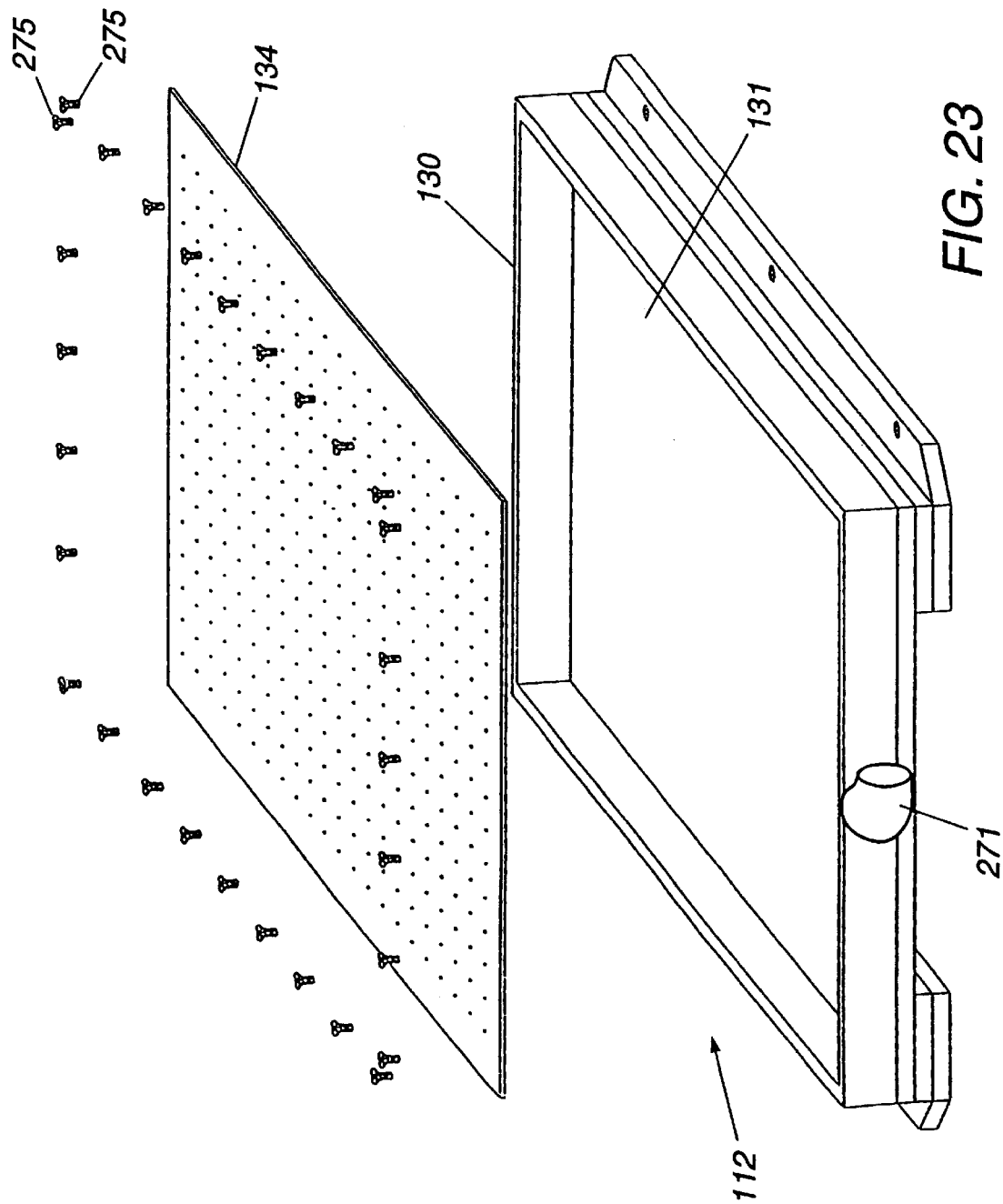
FIG. 23 is an exploded view of the fluid bed assembly of the conveyorized electroplating device of the present invention shown in FIG. 21.

FIGS. 21–23 illustrate another embodiment of the conveyorized electroplating device 110 of the present invention. The conveyorized electroplating device system 100 comprises two fluid bed assemblies 112, a lower anode assembly dam 277, upper and lower bearing block supports 121, absorptive applicator assemblies 116, and portions of housing 108. The conveyor device 114 previously discussed is also used in this embodiment; however, it has been omitted from FIGS. 21–23 for clarity purposes. The fluid bed assembly 112 shown in FIG. 23 comprises a manifold 130 and an anode 134. The manifold 130 is a substantially rectangular member having an inlet 271, a receptacle portion 131 and a mounting flange 273 on opposing sides of the manifold 130. The anode 134 consists of a substantially rectangular planar member fabricated from a material suitable for the material of the substrate having holes 148 extending therethorough. For example, if the substrate is to be plated with copper, the anode 134 may be copper and the plating solution may be a copper acid bath. Also the anode may be, for example, titanium or titanium with a coating. Furthermore, the anode 134 may be non-sacrificial and inert such as titanium or titanium with a coating and the plating solution may be a tin bath. However, one of ordinary skill will appreciate that a variety of anodes and plating solutions may be used. The anode 134 is connected to the manifold 130 at its periphery by stainless steel screws 275 and the fluid bed assembly 112 is then connected to the housing (not shown).

The lower anode assembly dam 277, shown in FIG. 21, comprises four vertical walls forming a rectangular shape, wherein the opposing side walls define recesses 279. The shafts 235 and 257 of the upper and lower roller assemblies 233 and 253 are received with the recesses 279. The lower anode assembly dam 277 also has a cut-out portion 281 at one end thereof that receives the tubular inlet member 271 of the manifold 130. The lower anode assembly dam 277 is supported by the fluid bed assembly 112 and connected to the anode 134 by fasteners (not shown). The vertical walls are notched to be received within the upper and lower bearing block supports 121. See FIG. 22.

The upper and lower roller assemblies 233 and 253, shown in greater detail in FIGS. 11–16 and described above, are rotatably received within upper and lower bearing blocks supports 121. The upper bearing blocks 121 have recesses 283 that rotatably receive a corresponding shaft 235 and flange member 239 of the upper roller assemblies 233. Similarly, the lower bearing blocks 121 have recesses 183 that are adapted to receive corresponding shaft 235 and flange member 239 of a corresponding lower roller assembly 253. The lower and upper bearing block supports 121 are rigidly connected to the housing 108 by any conventional fasteners, including screws, bolts, rivets, etc. In operation, plating solution enters the fluid bed assembly 112 through inlet 271 of the manifold 130 and exits the fluid bed assembly 112 through the anode holes 148 and is applied to the roller assemblies 233 and 253 of the absorptive applicator assemblies 116, wherein the plating solution will be transferred to both sides of the substrate as it moves over the absorptive applicator assemblies 116. The lower anode assembly dam 277 prevents the plating solution from spilling over the sides of the fluid bed assembly 112 as it exits the anode holes 148 thus, redirecting the solution onto the absorptive applicator assemblies 116. The lower anode assembly dam 277 creates a reservoir for the plating solution thus, keeping the roller assemblies 116 wet with the plating solution. This results in the substrate 217 also remaining wet with plating solution thus preventing "burning" of the substrate 217. Burning is when the substrate 217 after being electroplated has darkened, uneven deposits associated with high current densities or a lack of metals to be plated or a combination of both. This burning can be prevented by keeping the substrate wet with plating solution.

Figure 24:
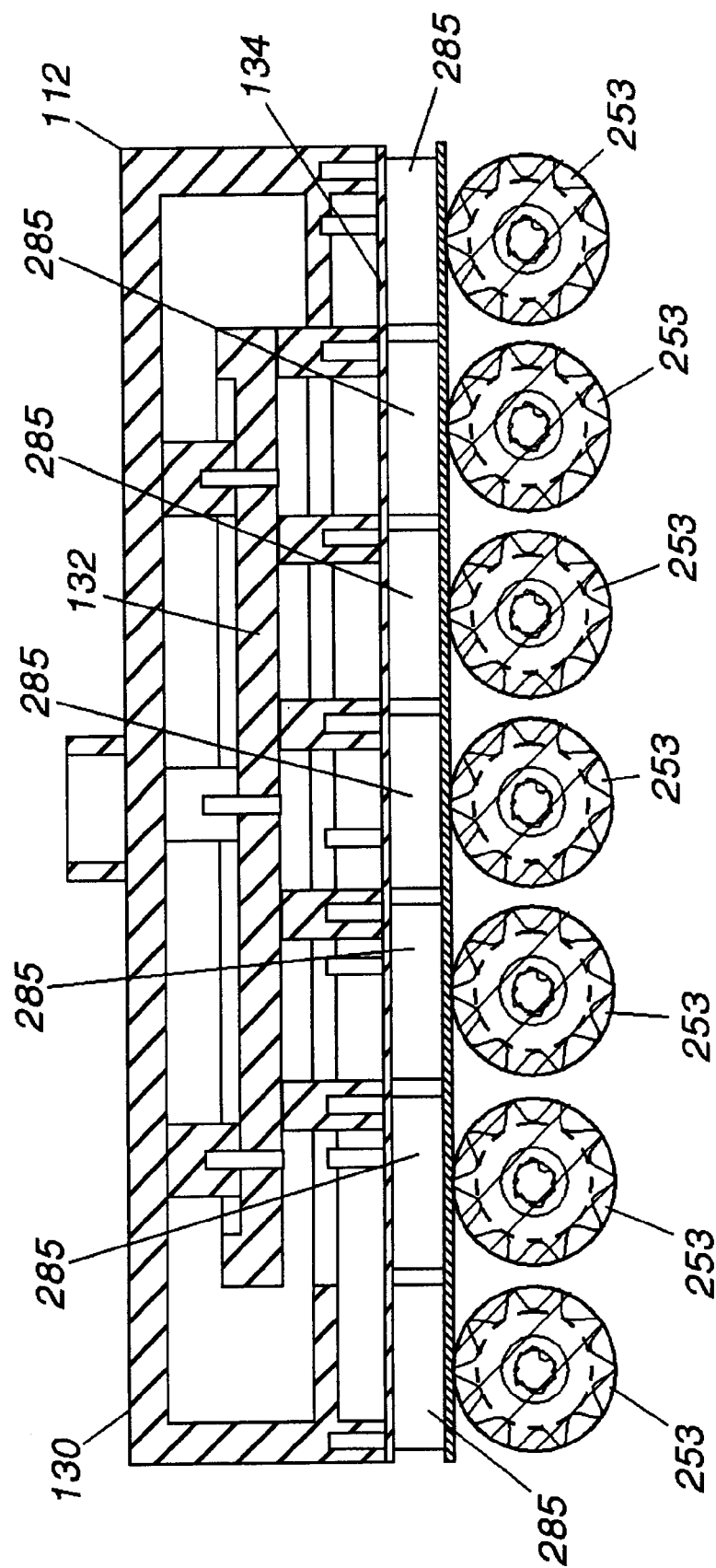
FIG. 24 is a sectional view of another embodiment of the coveyorized electroplating device of the present invention having absorptive applicator assemblies.

FIG. 24 is a sectional view of another embodiment of the conveyorized electroplating device 110 of the present invention having absorptive applicator assemblies 116 in the form of strips or block members 285. This embodiment comprises the lower roller assemblies 253, as described above, positioned below the substrate 217 and block members 285 made of absorptive material being mounted over the holes 148 of the anode 134 such that the plating solution that is pumped through the fluid bed assembly 112 will exit the holes 148 in the anode 134 and be delivered to the substrate. The block members 285 may be made from polyethylene, polypropylene or polyvinyl alcohol or any other material that is flexible and absorbent and chemically compatible. In this embodiment, the block members 285 are in direct contact with the substrate; however the block members 285 may be spaced from the substrate.

Figure 25:
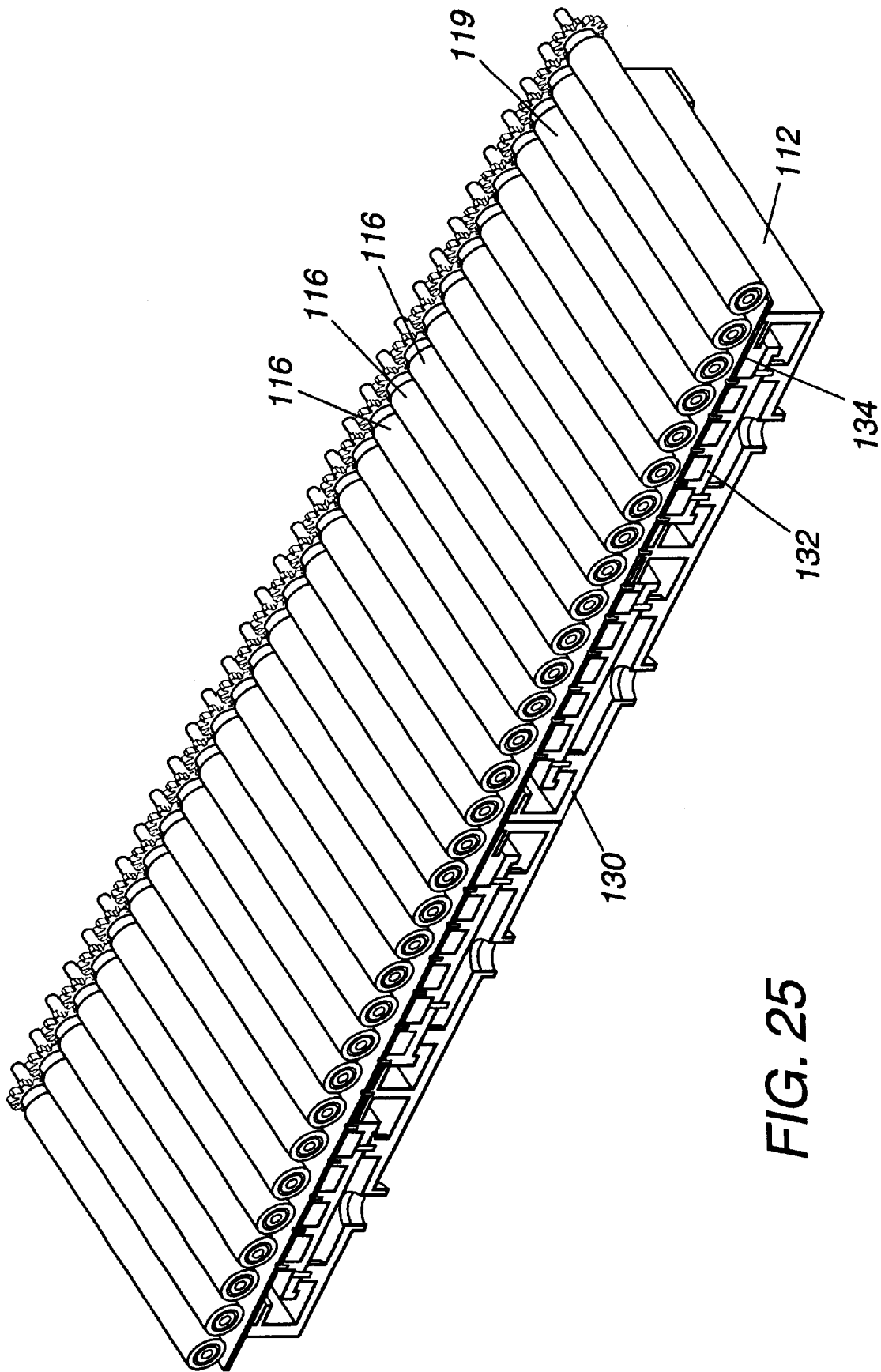
FIG. 25 is a perspective view of yet another embodiment of the conveyorized electroplating device of the present invention.
Figure 27:
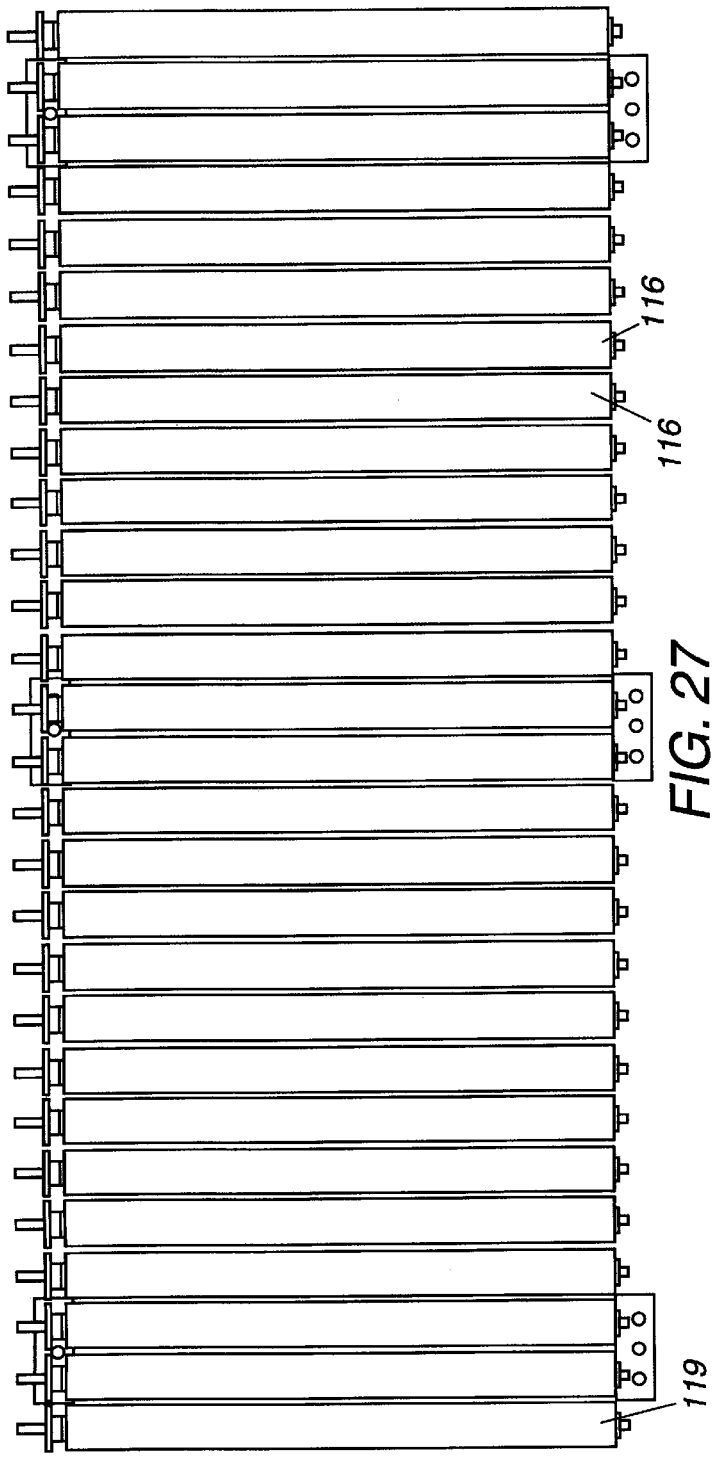
FIG. 27 is a top view of the conveyorized electroplating device shown in FIG. 25.
Figure 26:
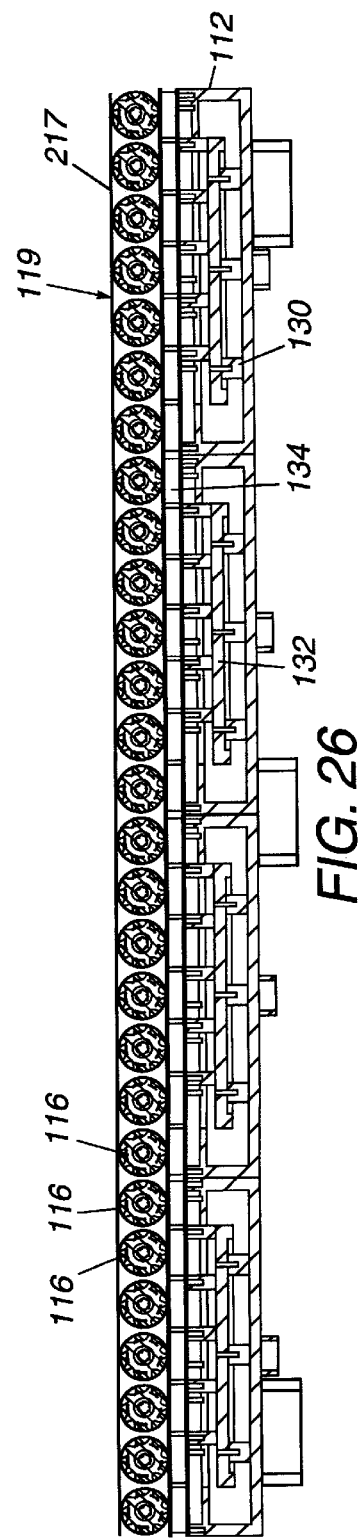
FIG. 26 is a sectional view of the conveyorized electroplating device shown in FIG. 25.

FIGS. 25–27 illustrate another embodiment of the conveyorized electroplating device 110 of the present invention, wherein driven absorptive applicator assemblies 116 engage the bottom of the substrate 217 (FIG. 26) and the plating solution is applied from the bottom of the substrate 217 through the anode 134. In this embodiment, only one fluid bed assembly 112 and one row of absorptive applicator assemblies 116 are used. The substrate 217 moves over the track 119 defined by the absorptive applicator assemblies 116. The absorptive applicator assemblies 116 are positioned above the fluid bed assembly 112. The fluid bed assembly 112 comprises a manifold 130, several baffles 132 and an anode 134, as described previously. The plating solution is pumped through the fluid bed assembly 112 exiting the anode 134 at the anode holes 148 and is applied to the absorptive applicator assemblies 116. As can be seen in FIG. 26, the absorptive applicator assemblies 116 are spaced from the anode 134; however, the absorptive applicator assemblies 116 may also contact the anode 134.

Figure 28:
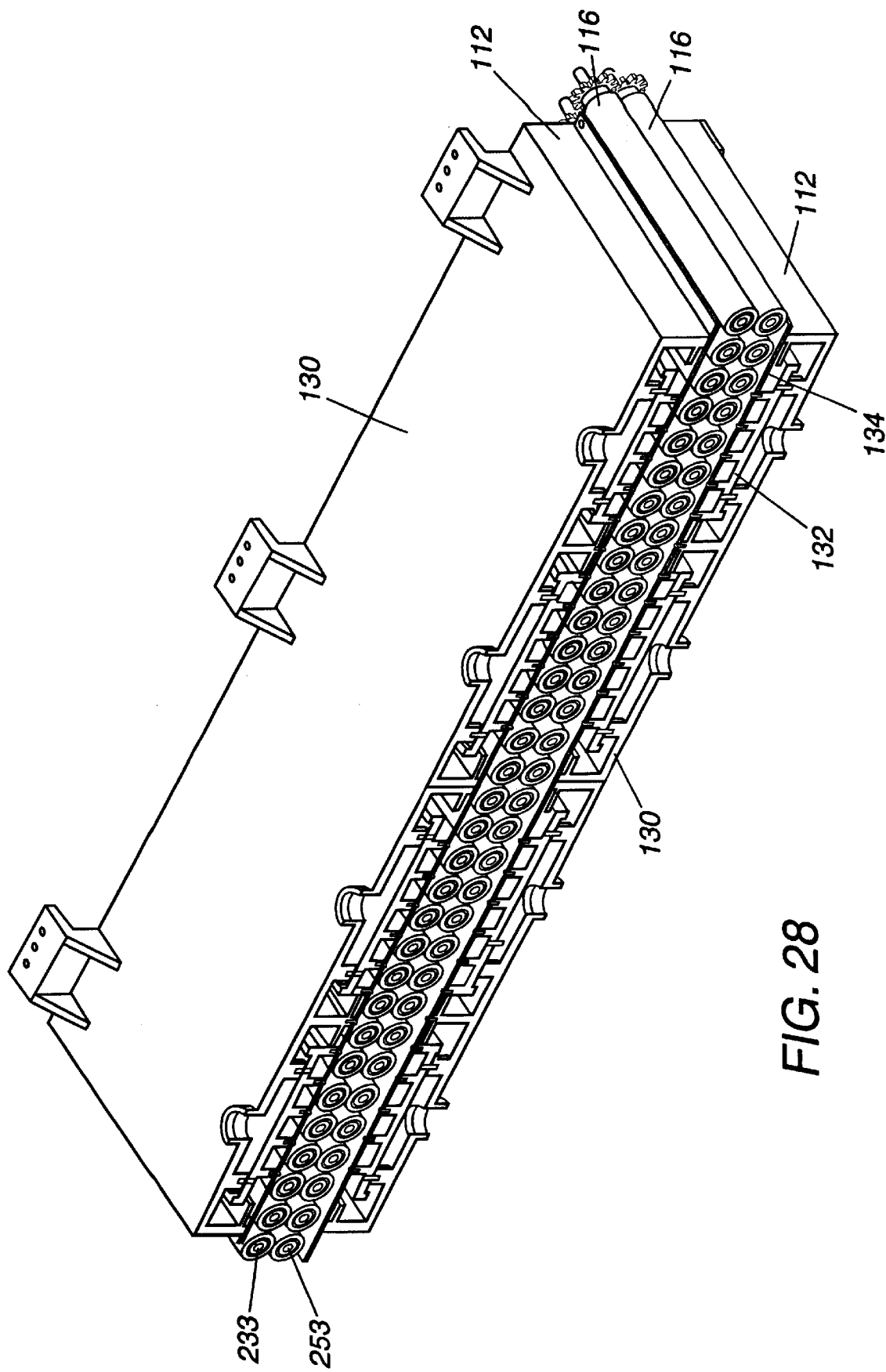
FIG. 28 is a perspective view of another embodiment of the conveyorized electroplating device of the present invention.

FIGS. 28–30 illustrate another embodiment of the conveyorized electroplating device 110 of the present invention, wherein the substrate 217 is positioned between two rows of the absorptive applicator assemblies 116 and the plating solution is applied to the top and bottom of the substrate 217.

This embodiment of the conveyorized electroplating device 110 comprises two fluid bed assemblies 112, two rows of absorptive applicator assemblies 116, the upper roller assemblies 233 and the lower roller assemblies 253, wherein the lower roller assemblies 253 are driven members and the upper roller assemblies 233 are free to rotate. Each fluid bed assembly 112 comprises a manifold 130, a plurality baffles 132 and an anode 134, all of which have been described above. The substrate 217 is driven by the lower roller assemblies 253 and the conveyor device 114 (not shown for clarity purposes). The plating solution is applied to both sides of the substrate 217 by the fluid bed assemblies 112. The solution is pumped out of the holes 148 of the anodes 134 onto the absorptive applicator assemblies 116, which are in contact with the substrate 217. Alternatively, the plating solution may be pumped through only one of the two fluid bed assemblies 112 thus, electroplating only one surface of the substrate 217. This embodiment also includes two spray bars 248 each having spray nozzles 249 for wetting the substrate 217 with the plating solution prior to engaging the absorptive applicator assemblies 116. By soaking the substrate prior to electroplating the substrate, the substrate is not susceptible to being depleted of solution during the electroplating process and thus, having an uneven "burnt" electroplated surface as a result. The spray bars 248 have nozzles 249 connected thereto which spray the plating onto the substrate 217. The spray bars are fluidly connected to the plating solution reservoir 111.

Figure 31:
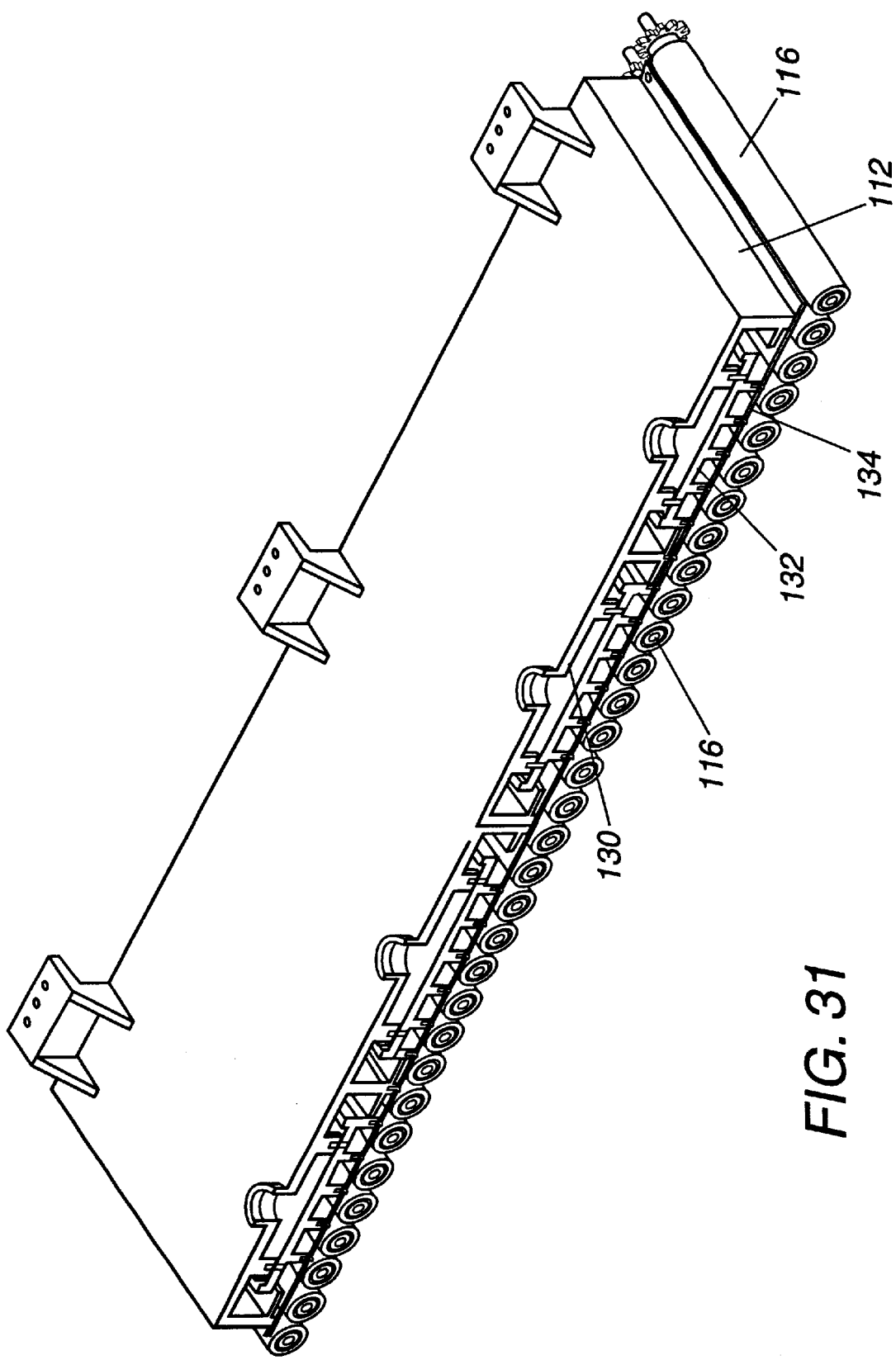
FIG. 31 is a perspective view of yet another embodiment of the conveyorized electroplating device of the present invention.
Figure 33:
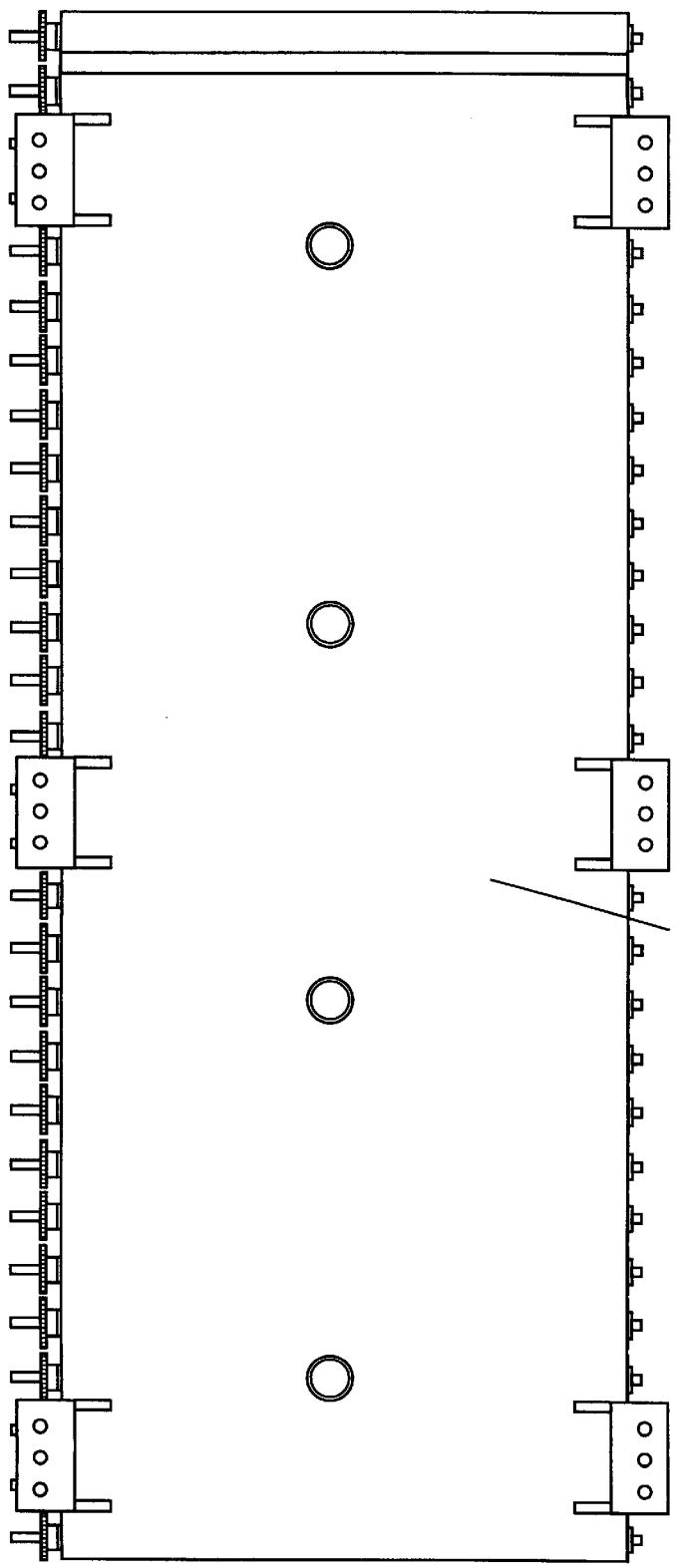
FIG. 33 is a top view of the conveyorized electroplating device of the present invention shown in FIG. 31.
Figure 32:
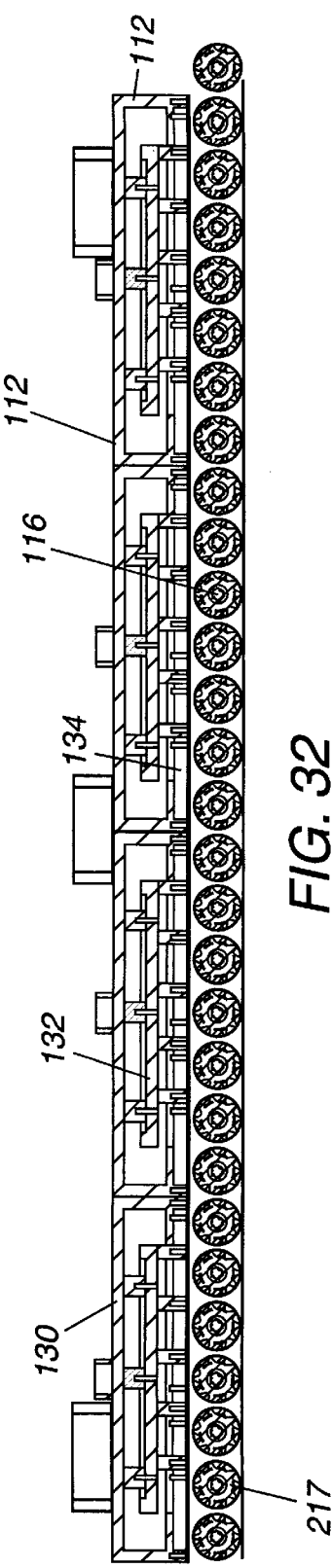
FIG. 32 is a sectional view of the conveyorized electroplating device of the present invention shown in FIG. 31.

FIGS. 31–33 illustrate yet another embodiment of the conveyorized electroplating device 110 of the present invention, wherein the substrate 217 is positioned above the driven absorptive applicator assemblies 116 and the plating solution is supplied through the anode 134 positioned above the substrate 217. In this embodiment, the conveyorized electroplating device 110 comprises one fluid bed assembly 112 positioned adjacent to the roller assemblies 116. The plating solution is pumped through the fluid bed assembly 112 exiting the anode holes 148 onto the roller assemblies 116 which come in contact with the substrate 217.

FIGS. 34–37 illustrate yet another embodiment of the conveyorized electroplating device of the present invention, wherein the substrate 217 is between upper and lower roller assemblies 233 and 253 and the plating solution is supplied through a fluid passageway defined by the upper and lower roller assemblies 233 and 253. In this embodiment of a conveyorized electroplating device 110, the plating solution is transported to the absorptive applicator assemblies 116 through a supply tubing system 300 such that the plating solution enters a fluid passageway 301 of the absorptive applicator assemblies 116 (FIG. 37) and is dispersed radially with respect to the absorptive applicator assemblies 116. The anode 302 has a profile that conforms with the absorptive applicator assemblies 116 such that the anode 302 is in contact with absorptive applicator assemblies 116 or spaced a relatively small distance away therefrom. For example, in one embodiment of the present invention, the anode 302 can be spaced approximately 0.125 inches to 0.25 inches away from the absorptive applicator assemblies. This embodiment eliminates a manifold and baffles. The absorptive applicator assemblies 116 form two rows of absorptive applicator assemblies 116, the upper and lower roller assemblies 233 and 253, wherein the substrate 217 is fed therethrough and the lower roller assemblies 233 are driven. The tubing system 300 comprises multiple tubes 303 that supply plating solution to each of the upper roller assemblies 233 from a main line 304. Although the plating solution is only being supplied to the substrate 217 through the upper roller assemblies 233, the solution may also be supplied to the substrate 217 from both the upper and lower roller assemblies 233 and 253.

Figures 38, 39:
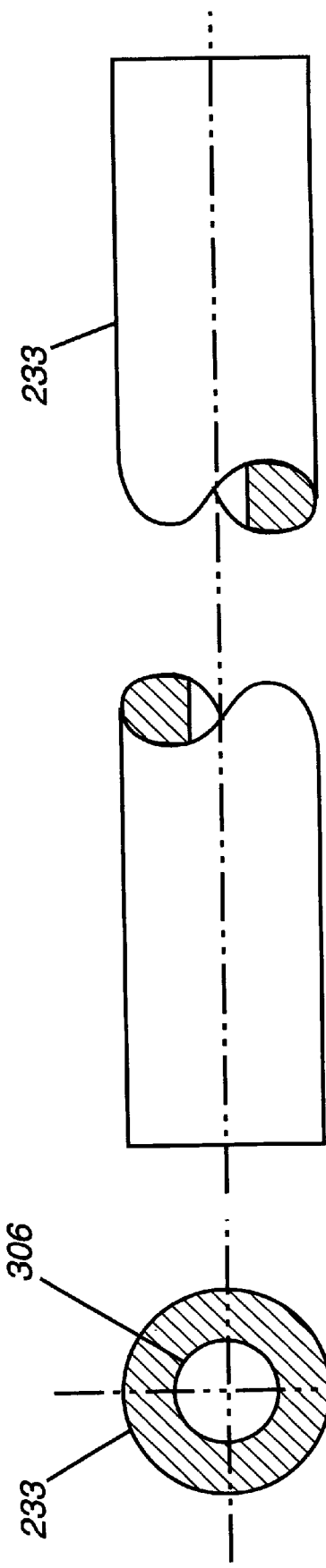
FIG. 38 is a side view of one of the absorptive applicator assemblies of the conveyorized electroplating device of the present invention shown in FIG. 34.
FIG. 39 is a sectional view of the absorptive applicator assembly shown in FIG. 38.

FIG. 38 and 39 illustrate upper roller assemblies 233 of the conveyorized electroplating device of the present invention shown in FIGS. 34–37. The upper roller assembly 233 is a tubular member defining a fluid passageway 306. One of the multiple tubes 303 is connected to the fluid passageway 306 such that plating solution can be delivered from the plating solution source (not shown), through the main tube line 304, through the multiple tubes 303 and into the fluid passageway 306. The tubular member is made from porous plastic such as polyvinylchloride or ceramic such that the plating solution entering the fluid passageway 306 is dispersed radially through the tubular member to the substrate 217.

Figure 41:
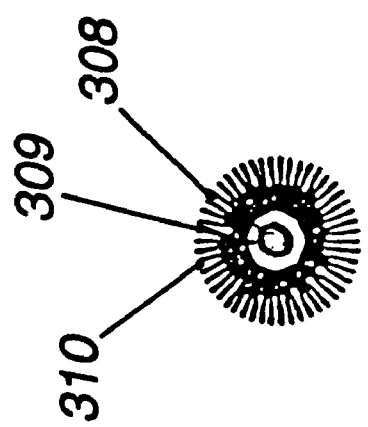
FIG. 41 is a sectional view of the shaft of the absorptive applicator assembly shown in FIG. 40.
Figure 40:
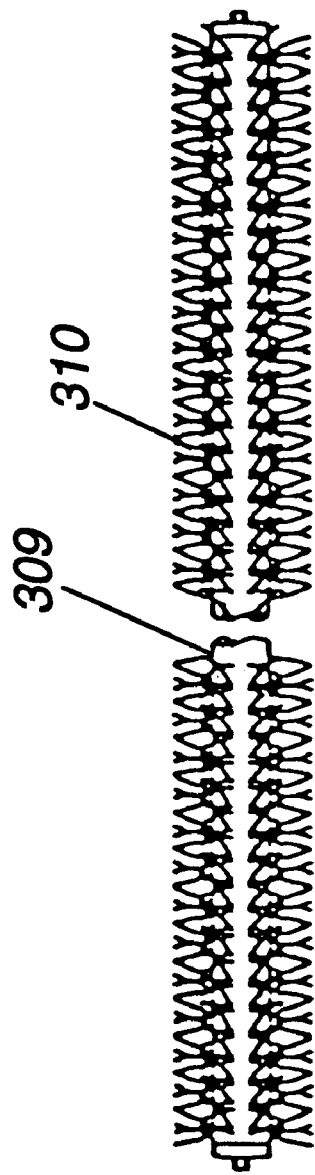
FIG. 40 is side view of another embodiment of the absorptive applicator assemblies of the conveyorized electroplating device of the present invention.

FIGS. 40 and 41 illustrate another embodiment of an absorptive applicator assembly 116 of the conveyorized electroplating device 110 of the present invention having bristles 310 protruding from the circumference thereof and defining a fluid passageway 308 therethrough for delivering the plating solution to the substrate 217. This embodiment of the absorptive applicator assembly 116 comprises a hollow shaft member 309 and a plurality of radially extending brush bristles 310. The brush bristles 310 extend around the entire circumference of the shaft 308. The brush bristles 310 comprise a U-shaped elongated channel member (not shown) within which the bristles extend. The channel member is crimped such that it is connected to the bristles and the elongated member is then wound around the shaft 308 where the channel member can be connected thereto by adhesive, clips or other fasteners. The tubes 303 supplying the plating solution are in fluid communication with the fluid passageway 308. The plating solution is delivered to the fluid passageway and is dispersed outwardly onto the substrate 217 which is in contact therewith. The shaft 308 is made from a porous plastic that allows for the plating solution to be dispersed radially outward and through the plastic. The bristles 310 then supply the plating solution to the substrate. The bristles 310 may be made from polypropylene or any other suitable material.

Figure 42:
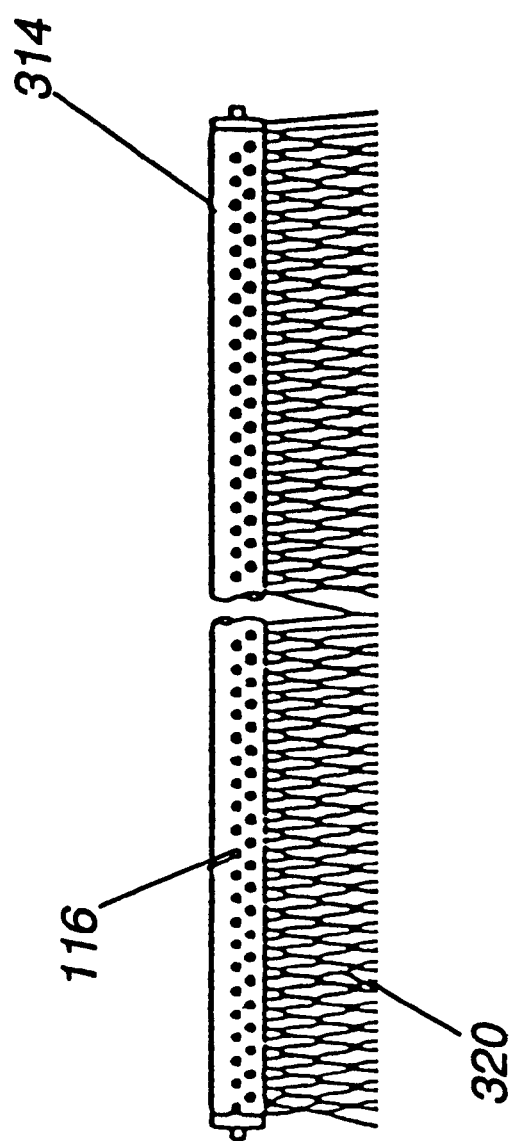
FIG. 42 is a side view of yet another embodiment of one of the absorptive applicator assemblies of the conveyorized electroplating device of the present invention.
Figure 43:
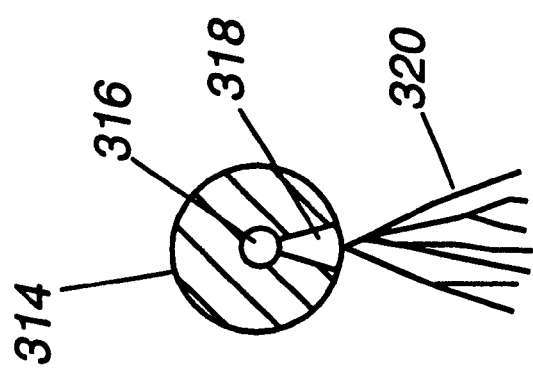
FIG. 43 is an enlarged sectional view of the absorptive applicator assembly shown in FIG. 42.

FIGS. 42 and 43 illustrate yet another embodiment of an absorptive applicator assembly 116 of the conveyorized electroplating device 110 of the present invention having a flat brush and defining a fluid passageway 316 therethrough for delivering plating solution. In this embodiment, the absorptive applicator assemblies 116 each comprise a tubular member 314 defining a fluid passageway 316 and a longitudinal slot 318 that extends the length of the tubular member 314. The absorptive applicator assemblies 116 further include a plurality of brush bristles 320 that extend radially from the tubular member 314 and cover a portion of the circumference of the tubular member 314 thus forming a flat brush. The plating solution is supplied from the multiple tubes 303, to the fluid passageway 316 of the tubular member 314 and it is directed to the brush bristles 320 by the slotted portion 318 of the tubular member 314. The bristles 320 engage the substrate 217 and apply the plating solution thereto. It will be appreciated that All of the absorptive applicator assemblies 116 illustrated in FIGS. 38–43 may be manufactured without a fluid passageway therein and thus, be adapted to be used in the embodiments of the present invention illustrated in FIGS. 1–33.

Although the present invention has been described in conjunction with preferred embodiments thereof, it is expected that many modifications and variations will be developed. This disclosure and the following claims are intended to cover all such modifications and variations.

What is claimed is:

1. A conveyorized electroplating device, comprising:
   a fluid bed assembly having a manifold and an anode, said manifold having at least one inlet and defining at least one receptacle portion, said anode being a substantially planar member having a plurality of holes extending therethrough, said anode connected to said manifold such that said anode extends across said at least one receptacle portion;
   a conveyor device adjacent to said fluid bed assembly; and
   a plurality of absorptive applicator assemblies defining a track, said plurality of absorptive applicators adjacent to said anode and in fluid communication with said fluid bed assembly.

2. The conveyorized electroplating device according to claim 1, wherein said fluid bed assembly further comprises a plurality of baffles, said plurality of baffles are connected to said manifold and are received within said at least one receptacle portion such that said anode and manifold contain said plurality of baffles.

3. The conveyorized electroplating device according to claim 2, wherein said anode is parallel to and in contact with said plurality of absorptive applicator assemblies.

4. The conveyorized electroplating device according to claim 2, further comprising a second fluid bed assembly also having a manifold, a plurality of baffles and an anode, said manifold having at least one inlet and defining at least one receptacle portion, said plurality of baffles connected to and received within said at least one receptacle portion, said anode being a substantially planar member having a plurality of holes extending therethrough, said anode connected to said manifold, and wherein said second fluid bed assembly and said first fluid bed assembly are positioned on either side of said plurality of absorptive applicator assemblies.

5. The conveyorized electroplating device according to claim 4, wherein said anodes of said first and second fluid bed assemblies contact said plurality of absorptive applicator assemblies.

6. The conveyorized electroplating device according to claim 3, wherein said plurality of absorptive applicator assemblies form two parallel rows.

7. The conveyorized electroplating device according to claim 3, wherein said plurality of absorptive applicator assemblies each comprise a roller assembly.

8. The conveyorized electroplating device according to claim 7, further comprising a plurality of bearing blocks connected to said manifold, said plurality of roller assemblies being rotatably connected to said at least one bearing block.

9. The conveyorized electroplating device according to claim 3, wherein said plurality of absorptive applicator assemblies each comprise a strip portion.

10. The conveyorized electroplating device according to claim 3, wherein said plurality of absorptive applicator assemblies each comprise a block portion.

11. The conveyorized electroplating device according to claim 3, further comprising an anode assembly dam connected to said anode.

12. The conveyorized electroplating device of claim 3, wherein said conveyor device comprises:
   a drive assembly having a frame, an actuator and a motor, wherein said actuator is connected to said frame and said motor is connected to said actuator; and
   a gripper assembly connected to said actuator, said gripper assembly having a housing, a member slideably mounted within a cavity defined by said housing, an arm pivotably mounted to said housing forming a passageway, and a seal mounted adjacent to said arm.

13. The conveyorized electroplating device of claim 1, wherein said conveyor device further comprises:
   a drive assembly having a frame, an actuator and a motor, wherein said actuator is connected to said frame and said motor is connected to said actuator; and
   a gripper assembly connected to said actuator, said gripper assembly having an electrically isolated housing, an electrically conductive member slideably mounted within a cavity defined by said housing, an arm pivotably mounted to said housing forming a passageway, and a seal mounted adjacent to said arm.

14. A conveyorized electroplating device, comprising:
   a plurality of absorptive applicator assemblies defining a track, each of said plurality of absorptive applicator assemblies defining a fluid passageway that is in fluid communication with a fluid supply, each of said plurality of absorptive applicator assemblies having a profile;
   a conveyor device adjacent to said track; and
   an anode adjacent said track, said anode having a profile that conforms to said profiles of said plurality of absorptive applicator assemblies.

15. The conveyorized electroplating device according to claim 14, wherein said anode contacts said plurality of absorptive applicator assemblies.

16. The conveyorized electroplating device according to claim 14, wherein each of said plurality of absorptive applicator assemblies comprise porous plastic rollers.

17. The conveyorized electroplating device according to claim 16, wherein each of said porous plastic rollers are made from one of woven polypropylene and polyethylene.

18. The conveyorized electroplating device according to claim 14, wherein each of said plurality of absorptive applicator assemblies comprise a tubular member having bristles extending radially from said tubular member, said tubular member defines said fluid passageway.

19. The conveyorized electroplating device according to claim 14, wherein each of said plurality of absorptive applicator assemblies comprise a tubular member defining the fluid passageway in the form of a slot along the length of said tubular member and a length of bristles extending within said slot.

20. The conveyorized electroplating device according to claim 14, wherein said conveyor device comprises:
   a drive assembly having a frame, an actuator and a motor, wherein said actuator is connected to said frame and said motor is connected to said actuator; and
   a gripper assembly connected to said actuator, said gripper assembly having a housing, a member slideably mounted within a cavity defined by said housing, an arm pivotably mounted to said housing forming a passageway, and a seal mounted adjacent to said arm.

21. The conveyorized electroplating device according to claim 14, wherein said conveyor device comprises:
   a drive assembly having a frame, an actuator and a motor, wherein said actuator is connected to said frame and said motor is connected to said actuator; and
   a gripper assembly connected to said actuator, said gripper assembly having an electrically isolated housing, an electrically conductive member slideably mounted within a cavity defined by said housing, an arm pivotably mounted to said housing forming a passageway, and a seal mounted adjacent to said arm.

* * * * *

UNITED STATES PATENT AND TRADEMARK OFFICE
CERTIFICATE OF CORRECTION

PATENT NO.   : 6,294,060 B1
DATED        : September 25, 2001
INVENTOR(S)  : Webb et al.

It is certified that error appears in the above-identified patent and that said Letters Patent is hereby corrected as shown below:

<u>Title page,</u>
Item [73], Assignee, please delete "ATI Properties, Inc." and insert -- Teledyne Technologies Incorporated -- thereof.

Signed and Sealed this

Fourteenth Day of January, 2003

JAMES E. ROGAN
*Director of the United States Patent and Trademark Office*